(12) United States Patent
Burns et al.

(10) Patent No.: US 8,564,297 B2
(45) Date of Patent: **\*Oct. 22, 2013**

(54) STUN DEVICE TESTING APPARATUS AND METHODS

(75) Inventors: Stephen Burns, Durham, NH (US); Bruno D. V. Marino, Brunswick, ME (US); Kenneth J. Stethem, Bellevue, ID (US)

(73) Assignee: Aegis Industries, Inc., Rockville, MD (US)

( \* ) Notice: Subject to any disclaimer, the term of this patent is extended or adjusted under 35 U.S.C. 154(b) by 0 days.

This patent is subject to a terminal disclaimer.

(21) Appl. No.: 13/616,652

(22) Filed: Sep. 14, 2012

(65) Prior Publication Data

US 2013/0049758 A1 Feb. 28, 2013

Related U.S. Application Data

(63) Continuation of application No. 12/564,980, filed on Sep. 23, 2009, now Pat. No. 8,324,902.

(60) Provisional application No. 61/099,529, filed on Sep. 23, 2008.

(51) Int. Cl.
*G01R 31/00* (2006.01)
*G01R 19/00* (2006.01)
*F41B 15/04* (2006.01)

(52) U.S. Cl.
USPC .................. 324/403; 324/76.11; 361/232

(58) Field of Classification Search
USPC ............... 324/534, 512, 500, 555, 403, 409, 324/76.11, 76.12; 361/232, 230; 452/58, 452/57, 54, 52
See application file for complete search history.

(56) References Cited

U.S. PATENT DOCUMENTS

| | | |
|---|---|---|
| 3,983,476 A | 9/1976 | Konopasek |
| 5,193,048 A | 3/1993 | Kaufman et al. |
| 5,201,865 A | 4/1993 | Kuehn |
| 5,209,228 A | 5/1993 | Cano et al. |
| 5,361,776 A | 11/1994 | Samuelson et al. |

(Continued)

FOREIGN PATENT DOCUMENTS

EP 1672650 6/2006

OTHER PUBLICATIONS

Braidwood Commission, "Restoring Public Confidence: Restricting the Use of Conducted Energy Weapons in British Columbia", Jun. 2009, Gov't BC, Victoria BC Canada, selected pages. [The Braidwood Commission Report comprises 556 pages in total. An electronic copy of the entire document is available at: http://www.braidwoodinquiry.ca/report/].

(Continued)

*Primary Examiner* — Hoai-An D Nguyen
(74) *Attorney, Agent, or Firm* — Merchant & Gould P.C.

(57) ABSTRACT

A method of testing an electric discharge stun device includes the steps of identifying a stun device to be tested and absorbing a discharge from the stun device into a tester. The discharge is characterized by a discharge characteristic that is then compared automatically to information such as (a) a previous corresponding characteristic associated with a previous discharge of the stun device or (b) a corresponding characteristic associated with a prior discharge of at least one other stun device. The characteristic can be a waveform, a peak voltage, duration, current, joule, and temperature.

20 Claims, 17 Drawing Sheets

(56) References Cited

U.S. PATENT DOCUMENTS

| | | | |
|---|---|---|---|
| 5,384,544 | A | 1/1995 | Flugstad et al. |
| 5,401,209 | A | 3/1995 | Ripol et al. |
| 5,698,815 | A | 12/1997 | Ragner |
| 5,708,375 | A | 1/1998 | Lemmens |
| 5,800,460 | A | 9/1998 | Powers et al. |
| 5,804,979 | A | 9/1998 | Lund et al. |
| 5,879,374 | A | 3/1999 | Powers et al. |
| 5,930,745 | A | 7/1999 | Swift |
| 5,986,872 | A | 11/1999 | Chaput |
| 6,185,458 | B1 | 2/2001 | Ochs et al. |
| 6,304,780 | B1 | 10/2001 | Owen et al. |
| 6,469,492 | B1 | 10/2002 | Britz |
| 6,575,073 | B2 | 6/2003 | McNulty, Jr. et al. |
| 6,621,913 | B1 | 9/2003 | de Vries |
| 6,636,412 | B2 | 10/2003 | Smith |
| 6,801,045 | B2 | 10/2004 | Hamm et al. |
| 6,807,762 | B1 | 10/2004 | Edwards |
| 6,924,648 | B2 | 8/2005 | Altmann et al. |
| 6,944,569 | B2 | 9/2005 | Harbord et al. |
| 7,039,544 | B2 | 5/2006 | Thalmann |
| 7,102,870 | B2 | 9/2006 | Nerheim |
| 7,158,362 | B2 | 1/2007 | Smith |
| 7,234,262 | B2 | 6/2007 | Smith |
| 7,237,352 | B2 * | 7/2007 | Keely et al. ............. 42/1.08 |
| 7,242,173 | B2 | 7/2007 | Cavoretto |
| 7,276,896 | B2 | 10/2007 | Moser et al. |
| 7,342,393 | B2 | 3/2008 | Newcombe |
| 7,471,092 | B2 | 12/2008 | Amanuma et al. |
| 7,662,030 | B2 * | 2/2010 | Cheek et al. ............. 452/57 |
| 8,139,339 | B2 | 3/2012 | Pakhomov et al. |
| 2004/0156163 | A1 | 8/2004 | Nerheim |
| 2006/0111750 | A1 | 5/2006 | Bowers |
| 2006/0206174 | A1 | 9/2006 | Honeycutt et al. |
| 2006/0273818 | A1 | 12/2006 | Takemoto |
| 2007/0079538 | A1 | 4/2007 | Smith et al. |
| 2007/0109712 | A1 | 5/2007 | Nerheim |
| 2007/0167241 | A1 | 7/2007 | Stethem et al. |
| 2007/0226574 | A1 | 9/2007 | Ryan et al. |
| 2008/0010888 | A1 | 1/2008 | Nerheim |
| 2008/0130193 | A1 | 6/2008 | Nerheim |
| 2010/0134090 | A1 | 6/2010 | Burns et al. |
| 2011/0040515 | A1 | 2/2011 | Miller et al. |

OTHER PUBLICATIONS

Datrend Home Page, accessed on Aug. 23, 2012 at: http://www.datrend.com/, 1 page.

Datrend Systems, Inc., "How Do You Assure the Performance of your Electronic Control Devices on a day-to-day basis?", Versus One ECD/CEW Analyzer, accessed online on Aug. 23, 2012 at: http://www.verusone.ca/uploads/Verus%20Brochure%20joint%20for%20website.pdf, no date, 2 pgs.

Datrend Systems, Inc., Technical Reference and Operations Manual, Versus One Automated ECD/CEW Analyzer, © 2011 Datrend Systems Inc., 163 pgs.

Datrend Systems, Inc., User Guide, Versus One Automated ECD/CEW Analyzer, © 2011 Datrend Systems Inc., 51 pgs.

Nerheim, RE: National Technology Systems (NTS) testing (correspondence), Dec. 2, 2008, TASER International Inc., Scottsdale AZ, 7 pgs.

Palmer. Testing of Conducted Energy Weapons, Canadian Police Research Centre, Ottawa, Ontario Canada, Jul. 22, 2008, pp. 1-32.

Sinclair, Taser Model X26 Test Concepts, Jan. 22, 2009, MPB Technologies Inc., Ottawa, Ontario Canada, 17 pgs.

Sinclair, Test Results for the M26 Conducted Energy Weapon, May 25, 2009, MPB Technologies Inc., Ottawa, Ontario Canada, 143 pgs.

Sinclair, Test Results for the X26 Conducted Energy Weapon, Apr. 6, 2009, MPB Technologies Inc., Ottawa, Ontario Canada, 104 pgs.

Versus One Home Page, accessed online on Aug. 23, 2012 at: http://www.versusone.ca/, 2 pgs.

"Effects of Current Passing Through the Human Body," IEC Publication 479-2, 2d ed., (1987), 48 pgs.

A. Esquivel, et al., "The Physiologic Effects of a Conducted Electrical Weapon in Swine," Annals of Emergency Medicine, vol. 50, Issue 5, pp. 576-583 (2007).

Effects of Current on Human Beings and Livestock, IEC Publication 479-1, 3d ed., (1994), 70 pgs.

Jeffrey D. Ho, MD, et al., "Cardiovascular and Physiologic Effects of Conducted Electrical Weapon Discharge in Resting Adults," Academic Emergency Medicine, 13:589-595 (2006).

Lakkireddy, D., et al., "Do electrical stun guns (TASERR-X26®) affect the functional integrity of implantable pacemakers and defibrillators?", EUROPACE, 9(7), 551-556 (2007).

Lakkireddy, D., et al., "Effects of cocaine intoxication on the threshold for stun gun induction of ventricular fibrillation," Journal of the American College of Cardiology, 48(4), 805-811 (2006).

Nelson Bennett, "Tasers' test results sparks invention," Richmond News (Sep. 9, 2009) (available at http://www2.canada.com/richmondnews/news/story.html?id=0fa3b787-b632-4543-a991-354de3f9cd74), pgs.

PCT International Search Report and Written Opinion in Application PCT/US2009/057977, mailed Jul. 12, 2009, 7 pgs.

Savard, P., et al., "Analysis of the Quality and Safety of the Taser X26 devices tested for Radio-Canada / Canadian Broadcasting Corporation by National Technical Systems," Test Report 41196-08.SRC (Dec. 2, 2008).

Valentino, D. J., et al., "Repeated thoracic discharges from a stun device," Journal of Trauma—Injury, Infection and Critical Care, 62(5), 1134-1142 (2007).

Valentino, D. J., et al., Neuromuscular effects of stun device discharges, Journal of Surgical Research, 143(1), 78-87 (2007).

* cited by examiner

STUN DEVICE TESTING APPARATUS AND METHODS

CROSS-REFERENCE TO RELATED APPLICATIONS

This application is a continuation of U.S. patent application Ser. No. 12/564,980, filed Sep. 23, 2009, which claims priority to and the benefit of U.S. Provisional Patent Application Ser. No. 61/099,529, entitled "Stun Device Testing Apparatus and Methods," filed Sep. 23, 2008, the disclosures of which are hereby incorporated by reference herein in their entireties.

FIELD OF THE INVENTION

This invention relates generally to systems and methods of testing electric discharge stun devices and, more specifically, to an apparatus that automatically tests the discharge of an electric stun device to determine if the device is functioning properly.

BACKGROUND

The use of neuromuscular incapacitation (NMI) devices (and other stun devices that emit electrical discharges against a target mammal) has increased over the last decade to encompass over 200,000 units in operation worldwide with over 800,000 actual firing deployments involving training personnel and law enforcement incidents. The output of stun devices is electrical in nature and thus may not leave an identifying mark or clear trace of historical events, unlike a bullet, that normally leaves such a mark. Furthermore, stun devices are designed to incapacitate effectively and temporarily an individual based on a unique and specific electrical output, as stated by a manufacturer.

Currently, there are many stun devices available around the world, featuring a variety of outputs with respect to voltage, current, waveform, and timing intervals. While many are available, however, only a limited number of manufacturers sell stun devices in a gun form-factor. U.S. Pat. Nos. 7,234,262 and 6,636,412 by Taser International and U.S. Pat. No. 6,575,073 by Stinger Systems all describe currently available commercial stun devices. The disclosures of these patents are hereby incorporated by reference herein in their entireties. The electrical output of each company's device differs significantly from the others and within each specified output for a given load, but each manufacturer makes their own claims of effectiveness and safety, as discussed below. The differences and characteristics of electrical output of stun devices are known from detailed and sophisticated measurements with a variety of specialized oscilloscopes and related measuring tools.

FIGS. 1 and 2 and TABLE 1 show detailed traces of waveforms under specific conditions using sophisticated oscilloscopes as well as a summary of typical electrical output for a variety of related, electrically-focused technologies used in the medical profession and other fields. FIG. 1 shows waveforms from a commercially available stun device of a handheld type, illustrating several important features of the waveform, including pulse height and charge, repetition rate, slope of the peak, duration of the waveform, changing shape of the waveform and total energy delivered. FIG. 2 shows additional details of an "idealized" waveform discharged by a device presently in commercial use, indicating a variety of characteristics. The characteristics shown in FIGS. 1 and 2 define the waveform of choice for a given device and manufacturer. TABLE 1 provides a comparison of stun devices, and includes similar information for biomedical devices employing electrical current, such as Electroconvulsive (ECT) therapy, cauterizing devices (electro-surgery), and defibrillators.

TABLE 1

Electrical Discharge Comparison of Various Device Types

| | Voltage | Current | Pulse Duration | Pulse Frequency | Power |
|---|---|---|---|---|---|
| Electric Fencing | 5-10 kV | 10-20 mA | 0.1-1 sec | 0.5-1 Hz | 0.1-18 J/pulse |
| Early Stun Devices 7 watt Taser | 40-100 kV | 3-4 mA | ~20 μsec | 5-20 Hz | 0.8 J/pulse |
| Current Stun Devices 26 watt Taser | 18-50 kV | 2-4 mA average 18 A peak | 11 μsec | 10-25 Hz | 0.1-1.8 J/pulse |
| ECS, ECT | 70-450 V | 20-900 mA | 1.5 msec | 70 Hz | 0.6 J/pulse |
| Defibrillators | ~750-1500 V | 20-65 A | 5-7 msec | 1-6 total | 100-360 J/pulse |
| Electrosurgery | 1000-9000 V | variable | variable | <200,000 Hz | 80-300 Watts |

It is helpful to note that a manufacturer's claim of effectiveness and safety must be linked directly to a consistent electrical output. Manufacturers have conducted various safety studies involving humans and animals to allay public fears and to use as a defense in litigation, where the actual output of the device is considered to have been a cause of injury or death of the target. Thus, lacking regulatory approval of a universal waveform, each company documents its waveform's safety by performing safety studies for its own devices. While safety factors of each waveform have been disclosed in publications, the device use data and associated instances of injury and death to date also reveals significant questions regarding safety. Thus, the identity and integrity of a specific waveform is of high value to a number of stakeholders including manufacturers, end-users (e.g., law enforcement) and the public on whom the devices are deployed for non-lethal purposes. Examples of studies resulting in claims of both safety and potential injury can be found, for example, in the following publications: Jeffrey D. Ho, MD, James R. Miner, MD, Dhanunjaya R. Lakireddy, MD, Laura L. Bultman, MD, William G. Heegaard, MD, MPH, "Cardiovascular and Physiologic Effects of Conducted Electrical Weapon Discharge in Resting Adults," ACADEMIC EMERGENCY MEDICINE, 13:589-595 (2006); Valentino, D. J., Walter, R. J., Dennis, A. J., Nagy, K., Loor, M. M., & Winners, J. et al., "Neuromuscular effects of stun device discharges," JOURNAL OF SURGICAL RESEARCH, 143(1), 78-87 (2007); Valentino, D. J., Walter, R. J., Nagy, K., Dennis, A. J., Winners, J., & Bokhari, F. et al., "Repeated thoracic discharges from a stun device," JOURNAL OF TRAUMA—INJURY, INFECTION AND CRITICAL CARE, 62(5), 1134-1142 (2007); A. Esquivel, E. Dawe, J. Sala-Mercado, R. Hammond, C. Bir, "The Physiologic Effects of a Conducted Electrical Weapon in Swine," ANNALS OF EMER- GENCY MEDICINE, Vol. 50, Issue 5, Pages 576-583 (2007); Lakkireddy, D., Khasnis, A., Antenacci, J., Ryshcon, K., Chung, M. K., & Wallick, D. et al., "Do electrical stun guns (TASER-X26®) affect the functional integrity of implantable pacemakers and defibrillators?," EUROPACE, 9(7), 551-556 (2007); and Lakkireddy, D., Wallick, D., Ryschon, K., Chung, M. K., Butany, J., & Martin, D. et al., "Effects of cocaine intoxication on the threshold for stun gun induction of ventricular fibrillation," JOURNAL OF THE AMERICAN COLLEGE OF CARDIOLOGY, 48(4), 805-811 (2006). The disclosures of these references are hereby incorporated by reference herein in their entireties.

Notwithstanding a manufacturer's claim of safety, electric stun device safety can only be assured if the stated waveform is both proven safe and is consistently produced and delivered by the device. Given the importance of this link between device output, safety, and effectiveness, we have determined it to be desirable that the output be verifiable for a given device during its cycle of normal duty and on a schedule of appropriate timing to ensure that only devices having outputs that are studied and verified safe are used on targets. However, there is no easy, simple way to verify device output on a regular basis within the typical law enforcement context. Thus, we have determined that verification of device output is needed in the law enforcement setting, in a testing apparatus that is simple to operate and inexpensive to purchase.

It also is reasonable to assume that as stun devices of different manufacturers and types become even more widely deployed and better studied, there will be a need to examine in detail the output of a specific device or class of devices. This output may be in relation to a specific incident or a class of incidents in which one or more devices are involved, including devices by different manufacturers. In such a case, currently, it is necessary to use sophisticated oscilloscopes operated by an expert or someone very familiar with the measurement equipment and the particular features of stun devices to capture, study and analyze the device's electrical output. Further, the waveform must be interpreted to assess whether it is, in fact, safe. While this approach may be helpful in determining the safety of a device right off the assembly line, stun devices are rarely, if ever, tested after being in the field for a period of time. Moreover, any tests performed on a particular device are often performed only after a discharge against a target has occurred, usually, and unfortunately, after there exists a reason for testing (e.g., an unintentional death of a target during deployment). There is essentially no focus on the actual routine verification of output prior to routine use. In addition, because electrical currents are transient and may not leave tangible traces that are currently recognized by the medical profession, the commonly recognized characteristics of an electrical discharge (voltage, amplitude, etc.) are often the only measure of output that was received by the target. These commonly recognized characteristics may not be sufficient, in all circumstances, to determine adequately or reliably the reason for an adverse result (i.e., a death of a target).

Moreover, if one follows the analogy of forensic study of ballistic evidence, it is clear that the capability to collect and analyze electric stun discharge evidence is lacking Thus, we have determined that it is highly advantageous to have a device or series of measurement devices that are easy to operate and interpret and are linked to the known waveform output of stun devices available. While some attempts are being made to develop systems to test particular stun devices from a specific manufacturer, these attempts do not appear to contemplate a device that test both existing and not-yet-developed stun devices, or to test and compile information on both existing and not-yet-developed stun devices to enable research into the safety and efficacy of electric waveforms and stun devices, generally. See, e.g., Nelson Bennett, "Tasers' test results sparks invention," Richmond News (Sep. 9, 2009) (available at http://www2.canada.com/richmondnews/news/story.html?id=0fa3b787-b632-4543-a991-354de3f9cd74), the disclosure of which is hereby incorporated by reference herein in its entirety. Additionally, having these devices readily available (both economically and physically) would allow law enforcement departments and forensic investigators and coroners the capability of in-depth analysis of stun device discharges, as needed.

Stun device output is a function, in part, of the internal electronic circuitry designed to produce a given waveform of a given magnitude and duration. We have determined that it would be desirable for the discharge output to be verified during the life cycle of a device. Changes in output can occur due to a number of factors, including, but not limited to, defective manufacture, component failure due to use, current leakage to operator, change in manufacturing components, deliberate alteration of components and power supply, etc. Additionally, manufacturers develop and sell successor models of stun devices (e.g., Taser models M18, M26, X26, wireless systems, sentry systems; see www.taser.com) and may alter the original waveform and output as models change over time. Moreover, nearly all projectile-based gun-platform stun devices may also deliver a subcutaneous electrical discharge significantly different than a discharge directly against the skin. Thus, manufacturers' stated claims of output should not be relied upon as accurate over the lifetime of use of the device, nor across successor models. It would be desirable to verify such output on a routine basis.

Currently, stun device output is not regulated at the state or federal level with respect to waveform or magnitude, nor are manufacturing standards tied to any stated degree of device performance or acceptable deviation from stated specifications. Without verification, there is little, if any, accountability for holding manufacturers responsible for quality performance features. The lack of verification is problematic for law enforcement officials who use the devices routinely and who may be involved in litigation due to a specific, often fatal, incident. Such details become important in complex deployment situations where drugs, alcohol and extreme agitation, as well as a victim's pre-existing conditions (such as use of pacemakers, etc.) are present. Medical experience has shown that risks from electrical stimulation include abnormal heart rhythms, epileptic seizures, cell injury and death. While there is an extensive history of the use of stun-devices with no apparent long term effects, the possibility exists. Variations from the normal stimuli are of particular concern. For example very fast, high-amplitude transients can produce injury inside of cells. Ventricular fibrillation can be induced more easily at some rates, as well. Thus, a convenient and cost effective program by law enforcement to track and record the features of the devices deployed over time may be desirable.

Currently, a number of oscilloscopes and other measuring devices are employed for the detailed analysis of waveforms and output of stun devices. Many of these measuring devices and oscilloscopes are sophisticated with respect to data capture rate, range and magnitude of signal, signal sampling parameters, and ability to analyze, record and handle large amounts of stored data. The technology involved in typical electrical output analysis includes a multimeter as described in U.S. Pat. No. 7,342,393, issued Mar. 11, 2008, to Newcombe; combination test instruments and voltage detectors as described in U.S. Pat. No. 7,242,173, issued Jul. 10, 2007, to Cavoretto; devices generating electronic test signals as described in U.S. Pat. No. 6,944,569, issued Sep. 13, 2005, to Harbord; digital oscilloscopes with waveform pattern recognition as described in U.S. Pat. No. 6,621,913, issued Sep. 16, 2003, to deVries; specialized circuits for measuring in-circuit resistance and current as described in U.S. Pat. No. 5,804, 979, issued Sep. 8, 1998, to Lund; and devices designed to detect minimum pulse widths of waveforms as described in U.S. Pat. No. 5,708,375, issued Jan. 13, 1998, to Lemmens. U.S. Pat. No. 6,469,492, issued Oct. 22, 2002, to Britz and U.S. Pat. No. 5,930,745, issued Jul. 27, 1999, to Swift disclose additional testing equipment. The disclosures of each of the above-identified references are incorporated by reference herein in their entireties.

Additionally, there are a number of devices that are used to measure and verify electrical signals from a variety of biomedical devices including defibrillators, as described in U.S. Published Patent Application No. 2007/0226574, published Sep. 27, 2007, by Ryan; pacemakers, as described in U.S. Pat. No. 5,209,228, issued May 11, 1993, to Cano; electro-surgery devices; and others. Many electrical testing devices provide comparisons with known electrical standards such as the International Electrotechnical Commission (IEC) and the Association for the Advancement of Medical Instrumentation (AAMI). The disclosures of each of the above-identified references are incorporated by reference herein in their entireties.

However, no universal test devices currently exist that can meet the needs described above for known and to-be-developed stun devices. Additionally, there presently exists no method for imposing accountability on users or manufacturers of stun devices by proving how a particular stun device was operating prior to discharge during routine use against a target. Moreover, there exists no system for collecting information about stun device discharge characteristics to study the effects of stun devices on an industry-wide basis.

SUMMARY OF THE INVENTION

The invention disclosed herein consists of one or more testing devices or apparatus that are capable of a spectrum of measurements and data-handling features. The testing devices according to the invention include an adapter for effective and safe coupling to an instrument capable of accepting, recording and analyzing the outputs of a stun device. Some of the contemplated testing devices include interchangeable adapters specific to testing particular stun devices. The testing device, in a basic form, may record only total electrical output, maximum voltage and current, or other simple numerical data. A more complex embodiment can also allow capture of waveform characteristics such as frequency, repetition rate, pulse train duration, anomalies, etc., at several different load options, each simulating contact with the human body. Other embodiments can provide options of waveform analysis, as compared to a "standard" waveform supplied by a manufacturer or other source. Embodiments of other devices can be equipped with data storage and analytical features, libraries of waveforms of various devices, statistical programs, and a variety of resistance factors simulating electrical pathways through human tissue. Other testing devices according to the invention can also be used to record total output and waveform features for repeated applications of stun devices. Furthermore, certain of these testing devices can report output relative to existing or new standards and regulations for the stun device industry as they are developed, relative to a variety of electrical safety standards in the U.S. or other jurisdictions, or relative to a set of specific standards for stun devices.

One difference between the technical features of many of the testing devices described in the Background and one embodiment of the stun device safety tester as described below, is the basic unit of electrical sampling. Available stun devices produce pulses with durations ranging from less than 1 microsecond to tens of milliseconds. In addition, transients associated with spark-gap type stun devices have durations that are fractions of a microsecond, as shown in FIG. 3 (note, e.g., leading spike on negative lobe). Thus, in contrast to defibrillator testers that measure single and very large pulses and pacemaker analyzers that measure relatively wide (slow) pulses over a very short period, the stun device tester in one embodiment will record the detailed behavior of waveforms with features ranging from very fast, high magnitude transients to normal pulse durations of tens of milliseconds. This suggests sampling rates of at least 20 mega samples/second for 10 milliseconds, demanding 200,000 words of storage to recreate waveforms or 20,000 words of storage to identify the presence of fast transients. In one embodiment, normal waveforms from a spectrum of devices can be captured and analyzed as well as chaotic and very fast anomalies that, to date, have not been characterized for stun devices. While the medical and safety significance of such transients and anomalies are not entirely understood, such aberrations can be identified and measured to assess their relevance and to help ensure claimed output parameters and safety.

In one aspect, the invention relates to a method of testing an electric discharge stun device, the method including the steps of identifying a stun device to be tested, absorbing a discharge from the stun device into a tester, the discharge including a discharge characteristic, and comparing automatically the discharge characteristic to information including at least one of (a) a previous corresponding characteristic associated with a previous discharge of the stun device and (b) a known corresponding characteristic associated with a discharge of at least one other stun device, wherein the discharge characteristic, the previous corresponding characteristic, and the known corresponding characteristic each include at least one of a waveform, an amplitude, a duration, a current, a voltage, an energy, and a temperature. In one embodiment, the comparing step includes the step of accessing the information from a storage medium remote from the tester. In another embodiment, the comparing step includes the step of accessing the information from a storage medium associated with the tester. In yet another embodiment, the method includes the step of reading an identifier associated with the stun device. In still another embodiment, the identification step includes identifying the stun device based on an analysis of the discharge characteristic.

In another embodiment of the above aspect, the at least one other stun device includes a plurality of stun devices. In yet another embodiment, the method includes the step of identifying at least one of an individual associated with the stun device and an individual conducting the test. In still another embodiment, the method includes the step of storing information including the characteristic of the discharge.

In another aspect, the invention relates to a method of ensuring proper operation of a stun device prior to a subsequent discharge against a mammalian target, the method including the steps of identifying a stun device to be tested, absorbing a discharge from the stun device into a tester, and authorizing the subsequent discharge based at least in part on a successful comparison of a discharge characteristic associated with the discharge to information including at least one of (a) a previous corresponding characteristic associated with a previous discharge of the stun device and (b) a known corresponding characteristic associated with a discharge of at least one stun device, wherein the discharge characteristic, the previous corresponding characteristic, and the known corresponding characteristic each include at least one of a waveform, an amplitude, a duration, a current, a voltage, an energy, and a temperature. In an embodiment of the above aspect, the authorizing step includes enabling the stun device to provide the subsequent discharge. In another embodiment, the method includes the step of storing information including the characteristic of the discharge in a storage medium. In yet another embodiment, the storage medium is remote from the tester. In still another embodiment, the storage medium is associated with the tester.

In another aspect, the invention relates to a tester for testing an electric discharge stun device, the tester including a stun device contact element for receiving a discharge from a stun device, a circuit connected to the contact element, a first storage medium for storing information corresponding to at least one of the stun device and the discharge from the stun device, a second storage medium for storing information regarding a known electrical discharge, wherein the information in the first storage medium and the second storage medium includes at least one of a waveform, an amplitude, a duration, a current, a voltage, an energy, and a temperature, a processor connected to the circuit for comparing information in the first storage medium to information in the second storage medium, and a stun device identification element connected to the processor. In an embodiment of the above aspect, the first storage medium includes the second storage medium.

In another aspect, the invention relates to a method of determining a biological response to an electrical discharge from a stun device, the method including the steps of absorbing the electrical discharge from the stun device into a tester, the discharge including a discharge characteristic, comparing automatically the discharge characteristic to a corresponding discharge characteristic associated with a known electrical discharge, wherein the discharge characteristic includes at least one of a waveform, an amplitude, a duration, a current, a voltage, an energy, and a temperature, and determining automatically an expected biological response based at least in part on the comparison. In an embodiment of the above aspect, the determining step includes obtaining information regarding a biological response to the known electrical discharge. In another embodiment of the above aspect, the biological response is selected from the group consisting of no response, partial tetany, substantially complete tetany, tetany, and cellular damage.

In another aspect, the invention includes an article of manufacture having a computer-readable medium with computer-readable instructions embodied thereon for performing the methods described in the preceding paragraphs. In particular, the functionality of a method of the present invention may be embedded on a computer-readable medium, such as, but not limited to, a floppy disk, a hard disk, an optical disk, a magnetic tape, a PROM, an EPROM, CD-ROM, DVD-ROM or downloaded from a server. The functionality of the techniques may be embedded on the computer-readable medium in any number of computer-readable instructions, or languages such as, for example, FORTRAN, PASCAL, C, C++, Java, PERL, LISP, JavaScript, C#, Tcl, BASIC and assembly language. Further, the computer-readable instructions may, for example, be written in a script, macro, or functionally embedded in commercially available software (such as EXCEL or VISUAL BASIC).

BRIEF DESCRIPTION OF THE DRAWINGS

Other features and advantages of the present invention, as well as the invention itself, can be more fully understood from the following description of the various embodiments, when read together with the accompanying drawings, in which.

DETAILED DESCRIPTION

Figure 1:
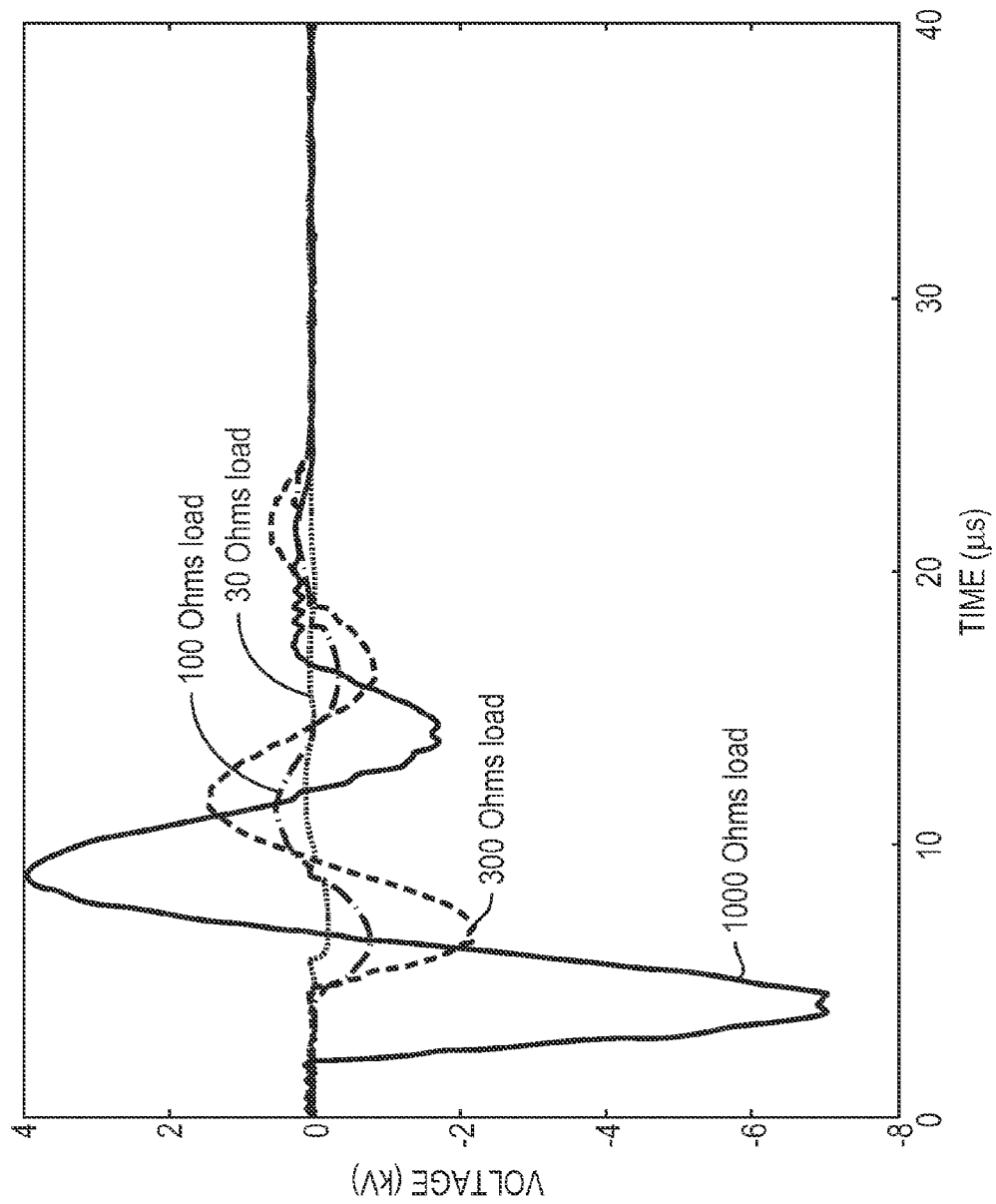
FIG. 1 depicts a graph of waveforms from a commercially-available stun device, under four different resistor loads.
Figure 2:
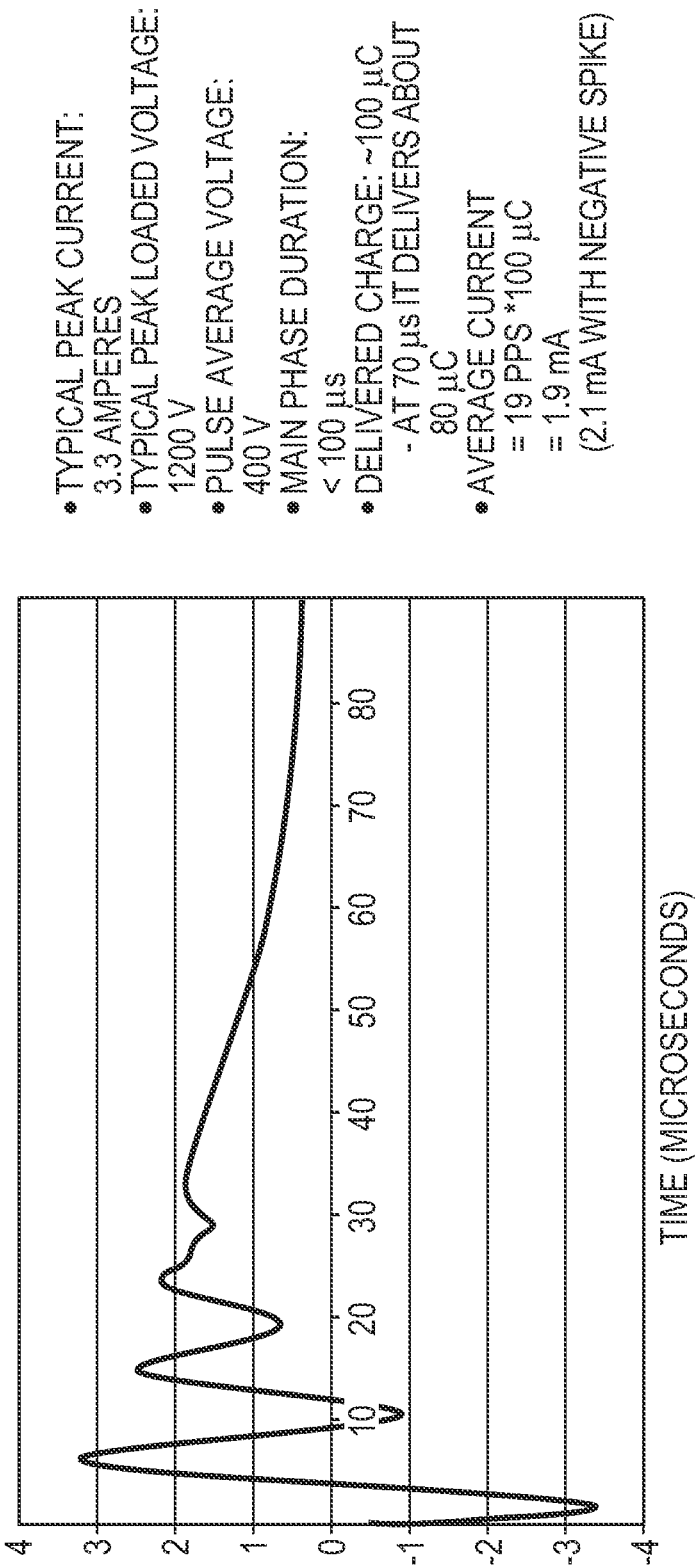
FIG. 2 depicts waveform detail and characteristics of a commercially available stun device.
Figure 3:
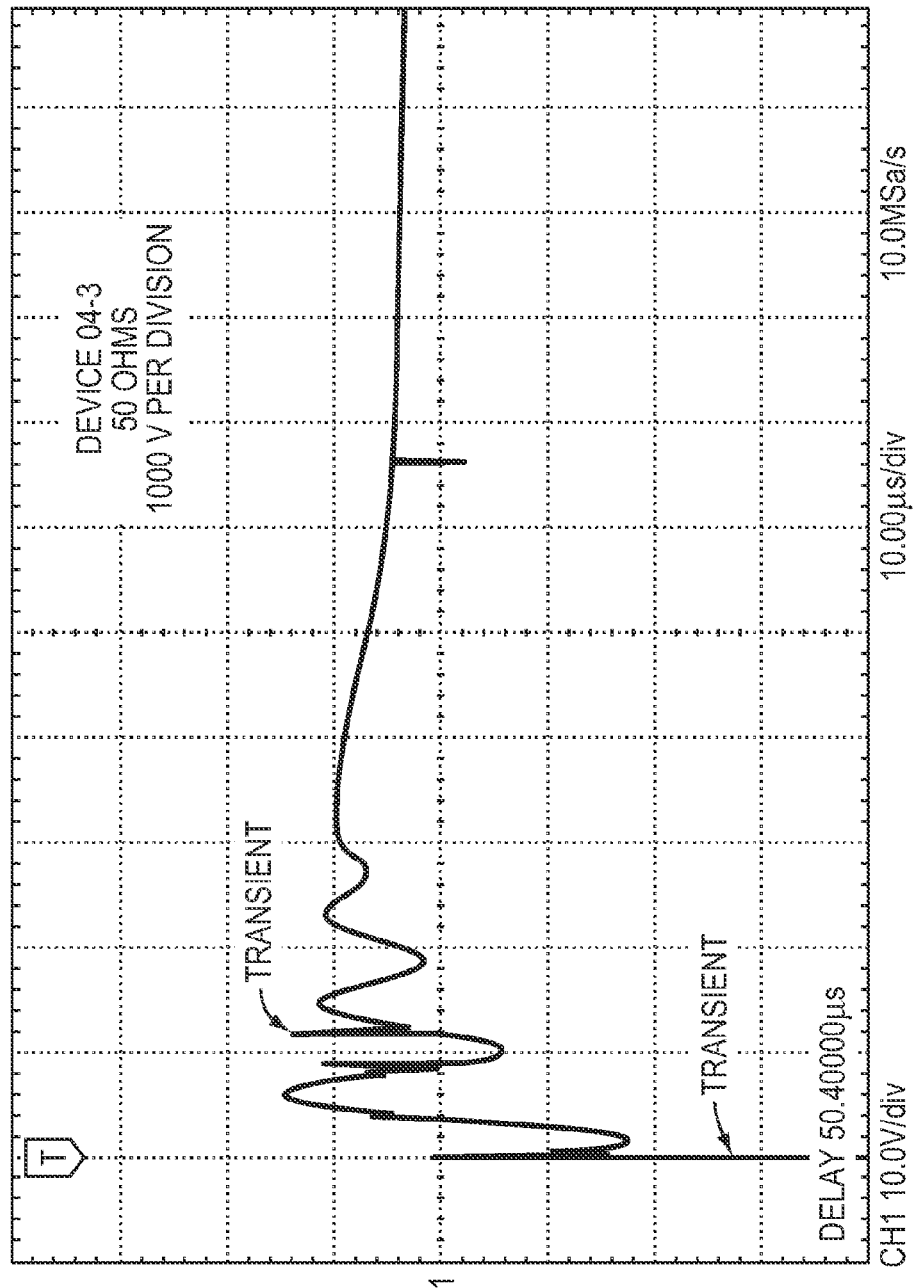
FIG. 3 depicts waveform detail of a particular waveform produced by the stun device of FIG. 2.
Figure 4:
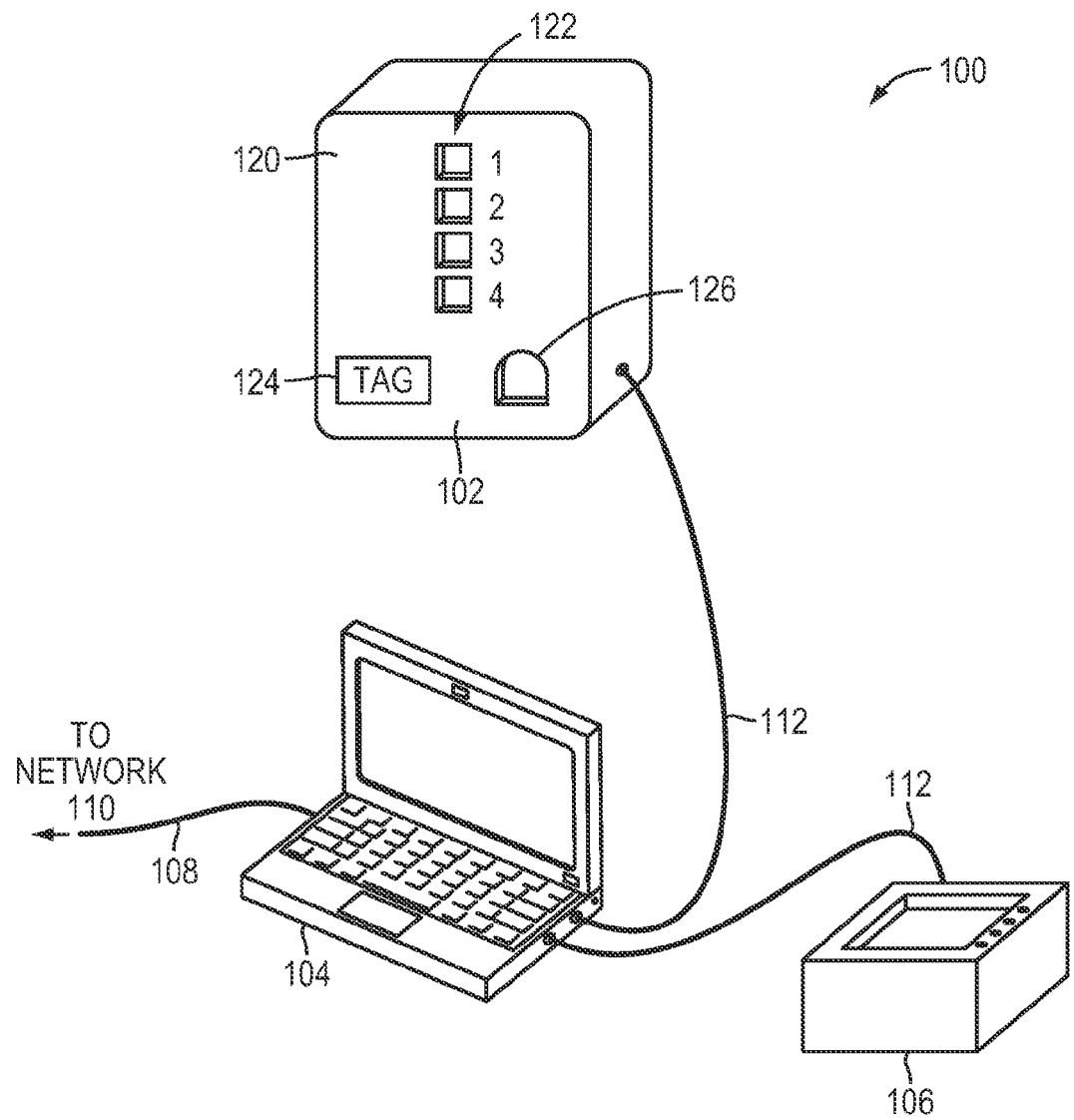
FIG. 4 depicts a schematic perspective view of a stun device testing and data storage system in accordance with an embodiment of the invention.

FIG. 4 depicts a schematic perspective view of a stun device testing and data storage system 100 in accordance with an embodiment of the invention. The system 100 may include a tester 102, a computer 104 of any type (desk top, hand-held, PDA, laptop, etc.), a printer 106, and, optionally, an ethernet or other connection 108 to an external network 110. The various components of the system 100 may be connected via cable connections 112 or a wireless connection (not shown) of any type. The depicted system is able to record and store captured data for analysis of waveforms. Such analysis may be supported by extensive libraries of waveforms and other analytical tools, such as single or multiple software programs for the specific purpose of analysis, as appropriate, to maintain, manage and/or verify outputs of stun devices. Moreover, reporting of data via secure data custody links can be integrated in state and federal databases for the effective tracking of device performance and safety compliance. These libraries may be maintained either within the tester 102, the computer 104, or in an external database, accessed via the network 110. The libraries of information may be accessed or updated on a regular or semi-regular basis by software utilized by the computer 104 or the tester 102. Additionally, the information obtained from the system 100 may be sent via the network 110 to an electronic information repository that stores, processes, analyzes, etc., information from any number of similar systems, thus quickly building a database of information to be used and accessed by all authorized users of the systems. Authorized researchers could also access the data repository to perform additional research and analysis.

In one embodiment of the invention, the data from each discharge may be stored in a first storage medium, remote from or local to the device. All other information (e.g., historical data from previously tested devices, known data from known stun devices or manufacturers, etc.) may be stored in a second storage medium. In this way, the information in the second medium may be updated on a regular or semi-regular basis (as described in further detail herein), while the information in the first medium serves as a record for all tests performed with the testing system. In certain embodiments, the first and second mediums may be a single medium for information storage.

In the system 100 depicted in FIG. 4, the tester 102 includes a shallow housing 120 that may be mounted on a wall at shoulder height. Alternative embodiments may be configured for table-top usage, or may be dimensioned to be portable. Such portable devices may be maintained in a carrying case and may include power, communication or other cabling required to use the tester in remote locations. The front of the box presents four testing ports 122 (labeled 1, 2, 3 and 4) and two identification ports 124, 126. The operation and configurations of the testing ports 122 are described below. In some embodiments, described below, a single port may be utilized to perform the measurements described herein, with the stun device tester automatically adjusting the resistance values and spark gap configurations during a stun device testing procedure. In other embodiments, two ports utilizing spark gaps and two ports without spark gaps may be used (adjusting the resistance values as required during a stun device testing procedure). Still other embodiments may utilize two low resistance ports and two high resistance ports (adjusting the spark gap as required during a stun device testing procedure).

In the tester 102 depicted in FIG. 4, the four testing ports are utilized to determine a terminal model of the stun device under test. Both the voltage and current developed by a stun device may be used to determine the terminal model. Voltage V is fairly straightforward to measure directly. Current I is usually measured by observing the voltage developed across a known resistance R (or impedance), and derived using the formula $I=V/R$. Thus, to determine the current, R must be known. The total actual resistance is the sum of the resistance of the source and the resistance of the load. The resistance of the load may be estimated by analysis or statistical measurement. In general, it has been determined that, for a stun device tester, a load resistance in the range of about 30 ohms to about 300 ohms is desirable. To predict the current developed by the stun device, the source resistance must also be determined. This can be done by measuring the voltage developed across two different, known load resistances. In one example, a first measurement is conducted with a 50 ohm load, which is associated with a first testing port 122 (port 1, for example) on the tester 102. A second measurement is conducted with a 100 ohm load, which is associated with a second testing port 122 (port 2, for example) on the tester 102. In the first measurement, 5000 volts is developed across 50 ohms; in the second measurement 6667 volts is developed across 100 ohms. The equations governing the two measurements may be simultaneously solved to determine that the source voltage is 10000 and the source resistance is 50 ohms. Thus, the two measurements (i.e., two experiments) yield two values that can be used to determine the source resistance.

The other two ports 122 (ports 3 and 4, for example) utilize a spark gap in series with the load resistance. Port 3, for example, utilizes a spark gap across 50 ohms; and port 4, for example, utilizes a spark gap across 100 ohms. Spark gaps generally have a very low resistance when conducting, accordingly, there is little appreciable increase in the load resistance. However, spark gaps may introduce transients in the stun device discharge that may affect the stimulus from the device in a potentially injurious way to a target. The behavior of spark gaps is dependent, in part, on the amount of current conducted by the spark gap. Accordingly, two of the ports repeat the measurements with two different load resistances, but also utilize the spark gaps to allow observation of their effect, if any.

The first identification port 124 may be utilized to read RFID tags on either or both of a stun device and a badge or other unique identification associated with a user. Alternatively, other readers (for example, bar code readers or other optical or tactile scanners) may be utilized. The second identification port 126 may also or alternatively be utilized to identify a user based on a biometric identifier, such as a user fingerprint. Other biometric systems (for example, voice detectors, retinal scanners, etc.) also may be utilized. A source of illumination may be associated with any or all of the elements and can be used to guide the user through the testing steps. The source of illumination may be a light bulb or light-emitting diode (LED) located within or proximate each port, for example.

The tester 102 can be used for purposes of registration and device characterization. In one embodiment of a test sequence, a user starts a stun device test by placing a finger in the fingerprint reader 126. The tester 102 responds by illuminating the fingerprint reader light. Additionally, the computer 104 may be activated to provide additional prompts to the user, or to record the testing sequence and results. Regardless, if the user is registered to use the system 100 and/or a stun device, the fingerprint reader light turns off and the light associated with the RFID reader 124 is illuminated. The user then positions the stun device by the reader 124. Successful reading of a registered stun device results in the illumination of testing port 1. The user places the stun device in testing port 1 and discharges the device. Successful reading results in turning off the light in testing port 1 and turning on the light in testing port 2. This process continues until the stun device has been successfully discharged at all four ports. The tester uses the associated computer 104 to archive the discharge data in the central repository (alternatively, the computer 104 may archive the data automatically, either at that time, or later) and, if desired, prints out a summary of the test results on an associated printer 106. The summary may include the measured average energy duration of each stimulus pulse, the number of pulses and total duration of the stimulus, an estimate of the battery condition based on the stun device's previous archived test results, changes observed within the current test, etc. Additionally, it may report the number and nature of observed variations from normal discharge. Advisory information including "Replace Battery" and "DO NOT USE" may also be included in the report. Additionally, the summary may include an image of the waveform, and/or other relevant characteristics thereof. The summary may also include an indication of whether the stun device is approved for subsequent use on a target, based on an analysis of the waveform or other discharge characteristic. The printed summary also may serve an important documentary function, creating a record of the operation of the device prior to use against a human target.

Figure 5:
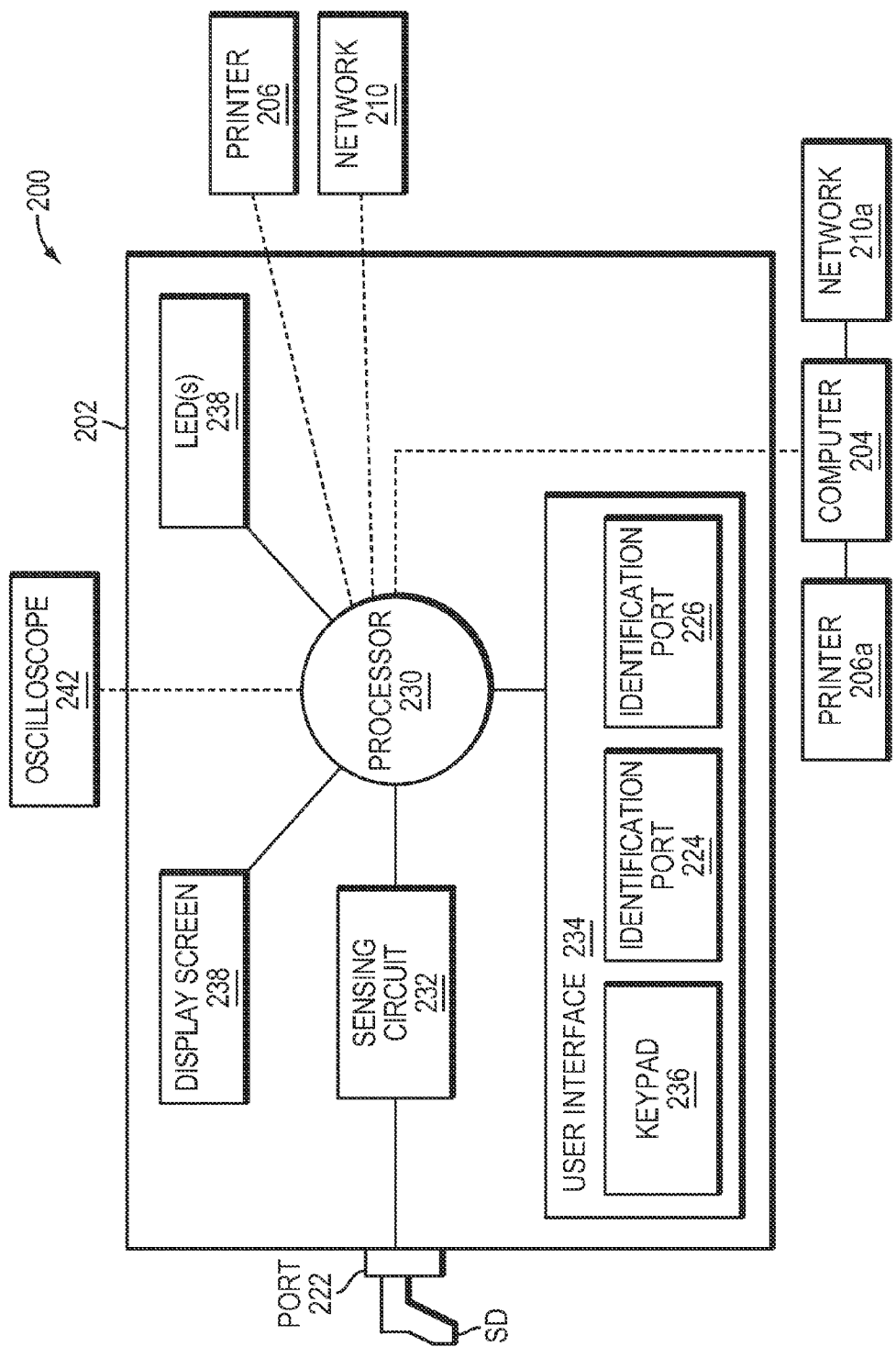
FIG. 5 depicts a schematic block diagram of a stun device testing and data storage system in accordance with another embodiment of the invention.

FIG. 5 is another embodiment of a stun device testing and data storage system 200. The system 200 includes a tester 202 having one or more testing ports or interfaces 222 for receiving a discharge end of a stun device SD. The tester 202 also includes a processor 230 for processing the data received from the stun device SD discharge, as well as for controlling the various elements of the tester 202, described below. The processor 230 receives information from a sensing circuit 232, which receives the discharge from the stun device SD. The processor 230 also communicates with the user interface 234, which may include one or more discrete components. One component may be a first identification port 224, as described above, i.e., a bar code scanner, RFID reader, etc. Other elements of the user interface 234 include a second identification port 226 (e.g., a fingerprint scanner, a voice recognition device, a retinal scanner, etc.). An alphanumeric keypad 236 (similar to those used on telephones) may also be utilized to enter identifying information about the stun device SD or user. In alternative embodiments, the keypad may be a complete keyboard typically utilized on a computer, either built into the tester or remote therefrom and connected by a cable. In other embodiments, a touch screen or voice recognition system having a graphical user interface may also be utilized.

The tester 202 provides information and feedback to a user via one or more integrated or remote components. For example, a display screen 238 may be utilized to present instructions, images of discharge waveforms, results, or other data to a user. In certain embodiments, the display screen 238 may be incorporated with the touch screen described above. One or more LEDs 240 may be used to provide simple instructions or feedback (e.g., "Proceed," "Fail," "Continue," etc.), and a piezoelectric sounder or other sound generating device may also or alternatively be utilized. Additionally, output from the processor 230 may be delivered to a remote oscilloscope 242 or signal analyzer for further research, analysis, or testing purposes. The tester 202 may send certain results to a printer 206, which, in certain embodiments, may be integral with the tester 202. Such an integral printer may be similar to a register printer that prints to a ribbon of paper media. The tester 202 may be a stand-alone device or may be connected directly to a network or internet connection 210, as described above. A stand-alone computer 204 may also be connected to the tester 202 to collect, process, and/or store test data, or to provide diagnostic testing of the tester 202 itself. As described above with regard to FIG. 4, the computer 204 may be connected to a stand-alone printer 206a, and/or a network 210a.

Figure 6:
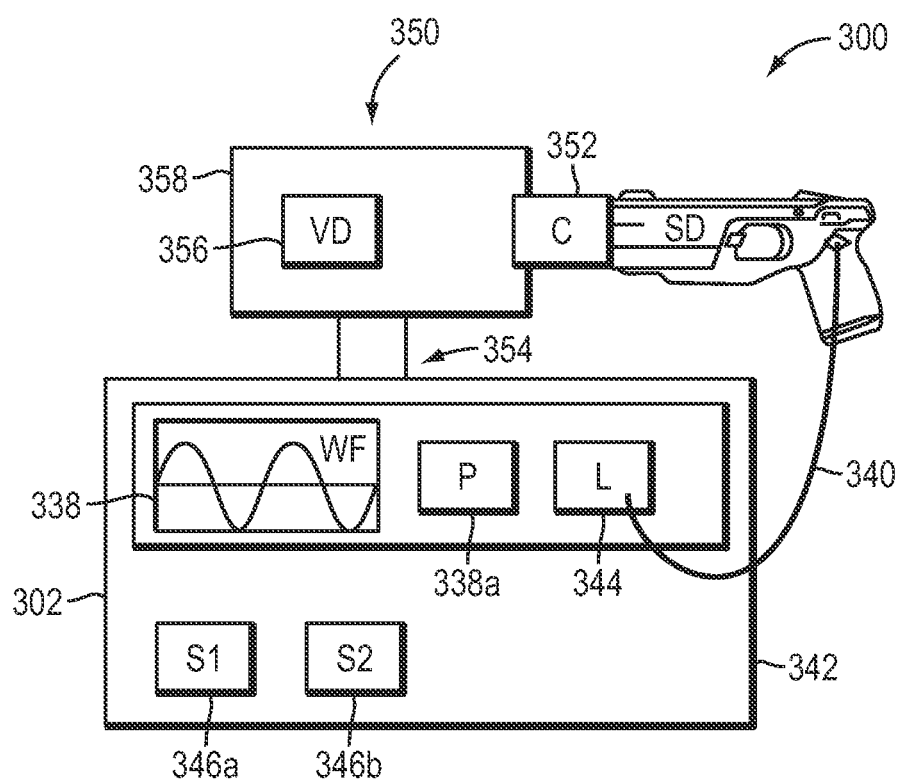
FIG. 6 depicts a schematic diagram of a stun device testing apparatus in accordance with another embodiment of the invention.

FIG. 6 depicts a schematic diagram of a stun device testing apparatus 300 in accordance with another embodiment of the invention. The testing apparatus 300 may include a stand-alone tester 302 that includes the circuits to test various stun devices SD. Additionally, the tester 302 may be connected to one or more adapters 350. Each adapter 350 may be manufactured to mate with the discharge end of a particular stun device SD via a coupling 352, and may include a common connector 354 configuration. The adapter 350 may include a voltage divider 356 within the adapter housing 358, as well as the stun device coupler 352. In certain embodiments, the voltage divider 356 may be utilized when the maximum voltage of a stun device is too high for the tester circuitry, and must be reduced to accommodate the measurement and prevent damage to the tester. While a voltage divider may not be required for several known devices on the market today, other devices exist or may be developed with specific characteristics that require modification for measurement on the safety tester. In certain embodiments, the voltage divider may be incorporated directly into the tester 302, as opposed to the adapter housing 358.

The coupler 352 connects the output leads of the device SD to the adapter 350. A coupler may be manufactured for each known stun device on the market or, alternatively, a universal coupler may be utilized to reduce costs associated with multiple custom couplers. Specifically configured couplers (or adapters, if the coupler is directly integrated into the adapter) may be required, because stun devices vary dramatically in form-factor. Some are large or small handgun formats, some are batons, and others are rectangular shapes. Some stun devices have protruding prongs and some utilize flat contact strips. Projectile-dart based stun devices should be measured with the dart accessory in place, as well as with the accessory disconnected, to verify output of the device when the external device contacts are pressed directly against the skin or penetrating the skin surface. In addition, the adapter 350 provides a high insulation factor to guard against electrical shock to the operator, since stun devices often have a high degree of arcing that can contact a nearby user during device actuation. Thus, an adapter/coupler combination is helpful to both secure a reliable connection to the tester 302 and to provide insulation to prevent electrical shock to users.

Figure 7:
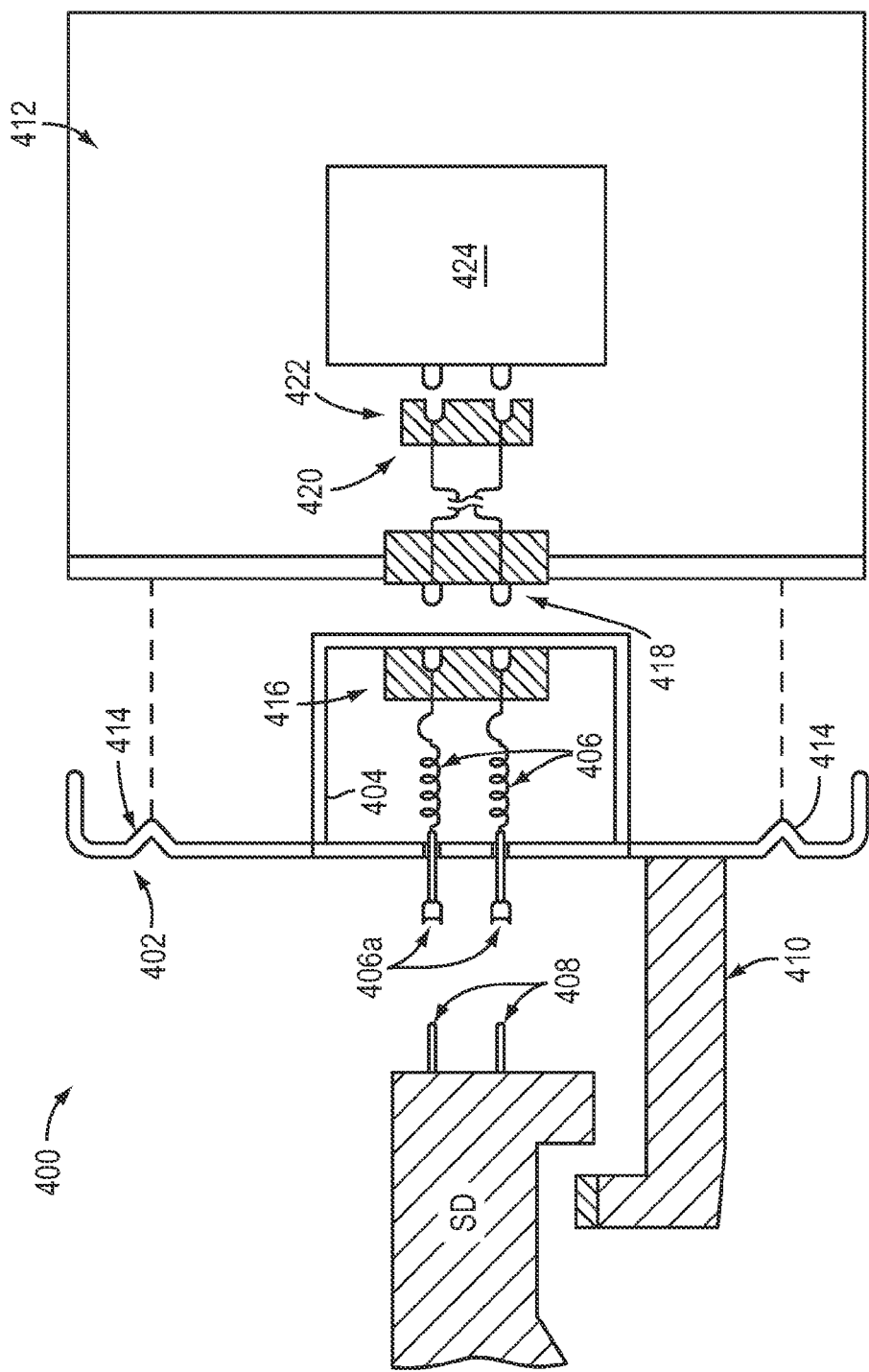
FIG. 7 depicts a schematic cross-sectional side view of an interface for a stun device testing apparatus in accordance with one embodiment of the invention.

Specifically configured interfaces, ports, or couplers (or adapters, if the coupler is directly integrated into the adapter) may also include supports or other physical structure to ensure proper alignment between the stun device and the tester. An exemplary, removable interface 400 is depicted in FIG. 7. The interface 400 includes a faceplate 402 secured to a receiving port or housing 404. Two compliant members or spring contacts 406 are secured within, and extend from, the receiving housing 404. Compliant members 406 (e.g., springs) help ensure contact between the contact tips 406a and the discharge elements 408 located on the stun device SD. The interface 400 may include a docking station or shelf 410 that provides reliable stun device SD placement and alignment. In certain embodiments, it may also enable the user to release the stun device SD during testing for safety purposes. The interface 400 may be secured to the tester 412 with screws, bolts, magnets, latches, spring clips, or other releasable coupling elements 414. Interfaces may be readily removable from the tester, allowing a number of interfaces adapted to receive specific stun devices to be used with a single tester, thereby reducing manufacturing costs.

The spring contacts 406 are connected to an interface connector 416 adapted to mate with a tester connector 418 located on the surface of the tester 412. The tester connector 418, in turn, may be wired to a PCB connector 422. The PCB connector 422 connects to a PCB 424 that performs the waveform testing and analysis. Utilizing a removable connection at the PCB enables an operator to remove the PCB 424 from the tester 412 for testing and servicing. Alternatively, a non-removable PCB may be utilized and the tester may be itself tested or updated via a USB port, a the network connection, etc. The configuration depicted in FIG. 7 allows different types of stun devices to be tested on the same tester, but the tester of the present invention could also be manufactured with a dedicated built-in interface configured for a single type of stun device. Other types of interfaces are also contemplated to test stun devices and stun guns that deliver electric waveforms utilizing launched projectiles. Since launched projectiles typically utilize barbs to secure to a target, interfaces that utilize compliant or perforated materials that may be penetrated by barbs are contemplated. Such interfaces may utilize screens manufactured of conductive materials, conductive rubbers or plastics, etc.

Returning to FIG. 6, the depicted testing apparatus 300 may include a display screen 338, that allows a user to view waveforms WF of the stun device SD discharge or other information. In certain embodiments, discharge periods for analysis can range from 1 to 45 seconds, simulating conditions of contact in the field during actual use. Such a signal capture feature P could be included along with other specific modes of signal capture and analysis for stun devices, and certain data regarding the discharge or the tester itself may be displayed for the operator on a second data display screen 338a. The displayed information may be used to aid an operator of the tester in making a determination regarding the operation of the stun device SD being tested, or regarding the operation of the tester 302 itself. In certain embodiments, however, the potentially subjective decision-making process of a human operator is bypassed in favor of a decision made by the tester 302 or an associated computer regarding the suitability of operation of a stun device SD. In such a case, one or both of the data display screens 338, 338a may be omitted from the tester 302 or reconfigured to display a status result (e.g., "OK to Use," "DO NOT USE," etc.).

Another feature that may be incorporated in the stun device testing apparatus 300 is the capability to measure current leakage and/or electrical breakdown from the stun device SD itself. An electrical cable/lead 340 extending from the tester housing 342 may be attached to the stun device SD to measure leakage by the apparatus 300. Information regarding the leakage may be displayed to a user via a leakage display 344 or one of the other display screens 338, 338a on the tester 302. Leakage or breakdown is dependent, in part, on the location and area of the contact providing the leakage or breakdown path, and is important to the operator of the tester 302, to prevent the operator from being incapacitated by the discharge during testing. Also, leakage can indicate a malfunction of the stun device SD. Again, not all information regarding leakage or breakdown need be presented to an operator. In such a case, the leakage display 344 may be omitted from the tester 302, and the tester 302 or the associated computer may make the necessary determinations regarding the safe operation of the stun device SD. In one embodiment, the type of leads utilized for EKG analysis of defibrillators and pacemakers may be employed to measure leakage. The apparatus 300 may also provide waveform analysis for a number of load conditions to simulate contact with differing parts of the body with differing intrinsic resistance and capacitance characteristics. Under such conditions, the internal circuitry of the stun device SD can behave in a consistent fashion to conserve the waveform for the purposes described previously.

The stun device testing apparatus 300 may also feature output from stun devices as compared against a variety of known and accepted electrical safety standards for electrical devices and for biomedical devices specifically. The apparatus 300 may incorporate one or more comparison outputs 346a, 346b, each offering a visual display or other representation of acceptable comparison and verification by the user. The testing apparatus 300 also may record individual waveforms and detailed time and date information of the tested device, and compare that information with standards based on the manufacturers' specifications, previously recorded discharge characteristics of the specific device, standards of other known devices, etc.

Figure 8A:
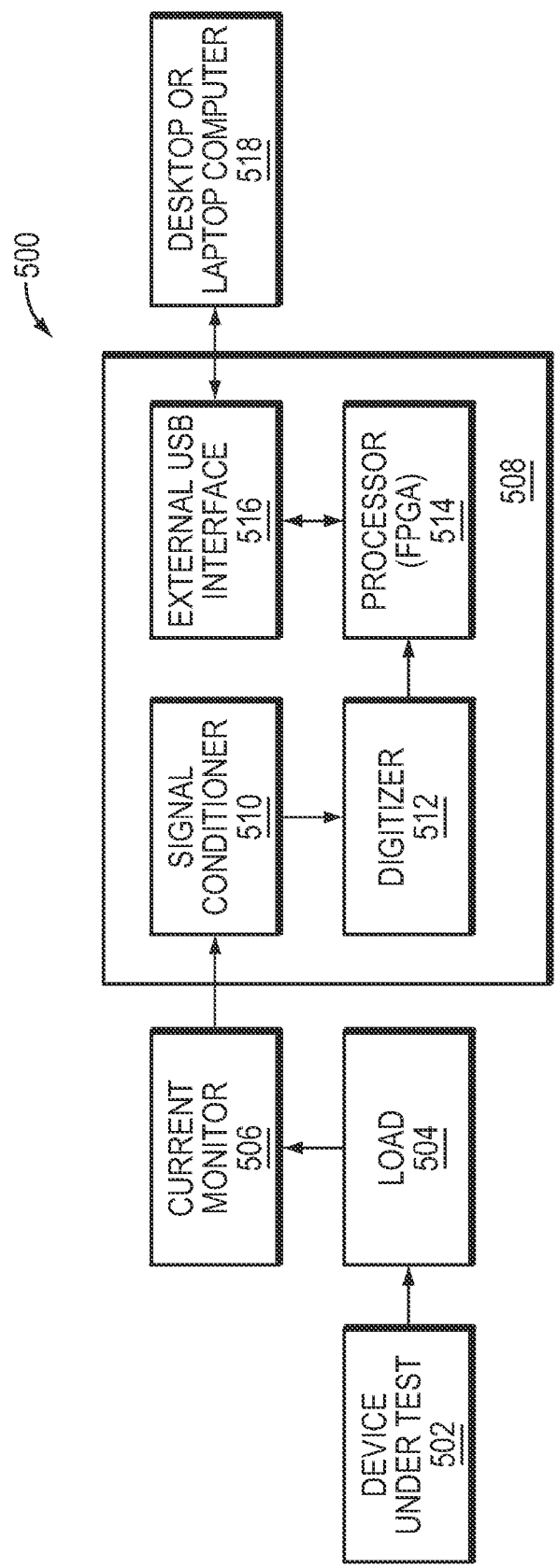
FIG. 8A is a schematic block diagram of a hardware configuration of a stun device testing apparatus in accordance with an embodiment of the invention.

FIG. 8A is a schematic diagram of a hardware configuration of a stun device testing apparatus 500 in accordance with an embodiment of the invention. A device under test (DUT) 502 (i.e., an electric waveform delivery device) is connected to a load 504, which accomplishes at least two goals: 1) a well-known voltage and current waveform can be produced by the use of Ohm's law (Voltage=Current×Resistance), and 2) the high voltage signal level from the DUT 502 will be reduced to a level that is not damaging to the analysis circuitry contained within the testing apparatus 500. In one embodiment, a network of resistive devices may be utilized, e.g., the resistive values of an exemplary network may be 100, 250, 500 and 1000 ohm. Each different resistive value may be attached to a computer-controlled relay, that may be either mechanical or electrical, depending on the anticipated energy level of the discharge impulse. The resistor and relay network is designed such that they are not mutually exclusive, thereby allowing a wide range of restive values with minimal impact on device size and cost.

The load 504 is connected to a current monitor 506, which outputs a voltage that is proportional to the current through the load 504. The voltage output of the current monitor 506 is then input to the printed circuit board (PCB) 508. The input signal is first conditioned 510 to match the input requirements of the digitizer (an analog to digital converter, A/D) 512. This conditioning includes several specific functions, including input filtering, digital attenuation, high-gain operational amplification (op-amp), and conversion operational amplification. Input filtering limits the noise bandwidth at the input to the A/D. Digital attenuation combines with the gain from the following stage (high gain operational amplification) to match the input signal level to the full-scale level of the A/D. In one embodiment, this attenuator has a range from about 1.0 dB to about 16 dB, which may be set via commands to a processor 514 or through the use of an on-board switch. The high-gain op-amp circuit is designed for a voltage gain of about ten. Coupled with the input attenuator, the output of this amplifier can be typically in a range of about 0-2V nominally. Finally, a single ended-to-differential conversion op-amp converts the signal into differential format and has an added level shift, since the original signal is DC-coupled.

Figure 9:
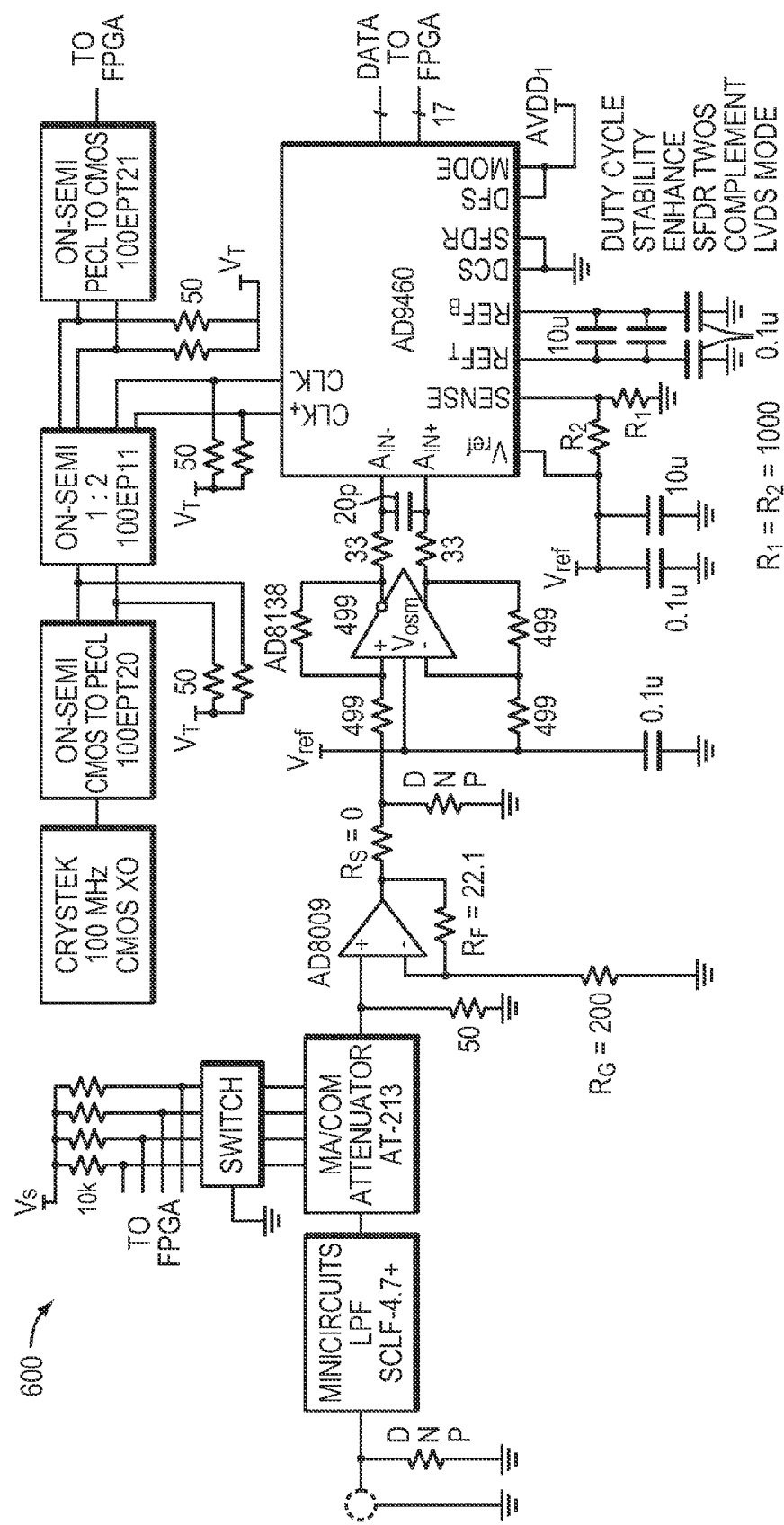
FIG. 9 is a schematic diagram of a circuit utilized in the hardware configuration of FIG. 8A.

In one embodiment, the A/D 512 operates at 100 MS/s (million samples per second) with a resolution of 16 bits. This configuration provides the user with the ability to "see" the waveform in 10 nanosecond steps in time, with a total of 65,536 steps in discharge intensity. The output of the A/D 512 is passed directly to the processor 514 (which, in certain embodiments, may be a field programmable gate array (FPGA)), using low-voltage differential signaling (LVDS). FIG. 9 depicts one embodiment of a circuit 600 utilized in the hardware configuration of FIG. 8A for load 504, the current monitor 506, the signal conditioner 510, and the A/D 512.

Returning to the hardware embodiment depicted in FIG. 8A, the FPGA 514 may be manufactured by Xilinx, Inc. FPGAs allow for a wide range of data manipulation techniques while being field re-definable for future product upgrades, features, enhancement, etc. Use of an FPGA 514 provides the option of elimination of external computer control (provided sufficient processing capability is present) of the testing apparatus 500. In that case, the FPGA can perform all of the data analysis internally, handle user display functions, etc. If an external computer is utilized, however, the FPGA may be utilized only for ancillary functions, such as data handling and communications scheduling. VHDL code can be utilized to accept data from the A/D 512 continuously while being stored in an internal or external memory array. Additionally, the FPGA 514 can accept commands to stop/start a test, capture data, switch resistive loads, etc. The FPGA 514 also handles all USB 516 communications from the computer running the graphical user interface. In certain embodiments, the communications interface may be defined by the USB 2.0 standard, which is robust, familiar, and readily available in most consumer-based computing electronics.

Figure 8B:
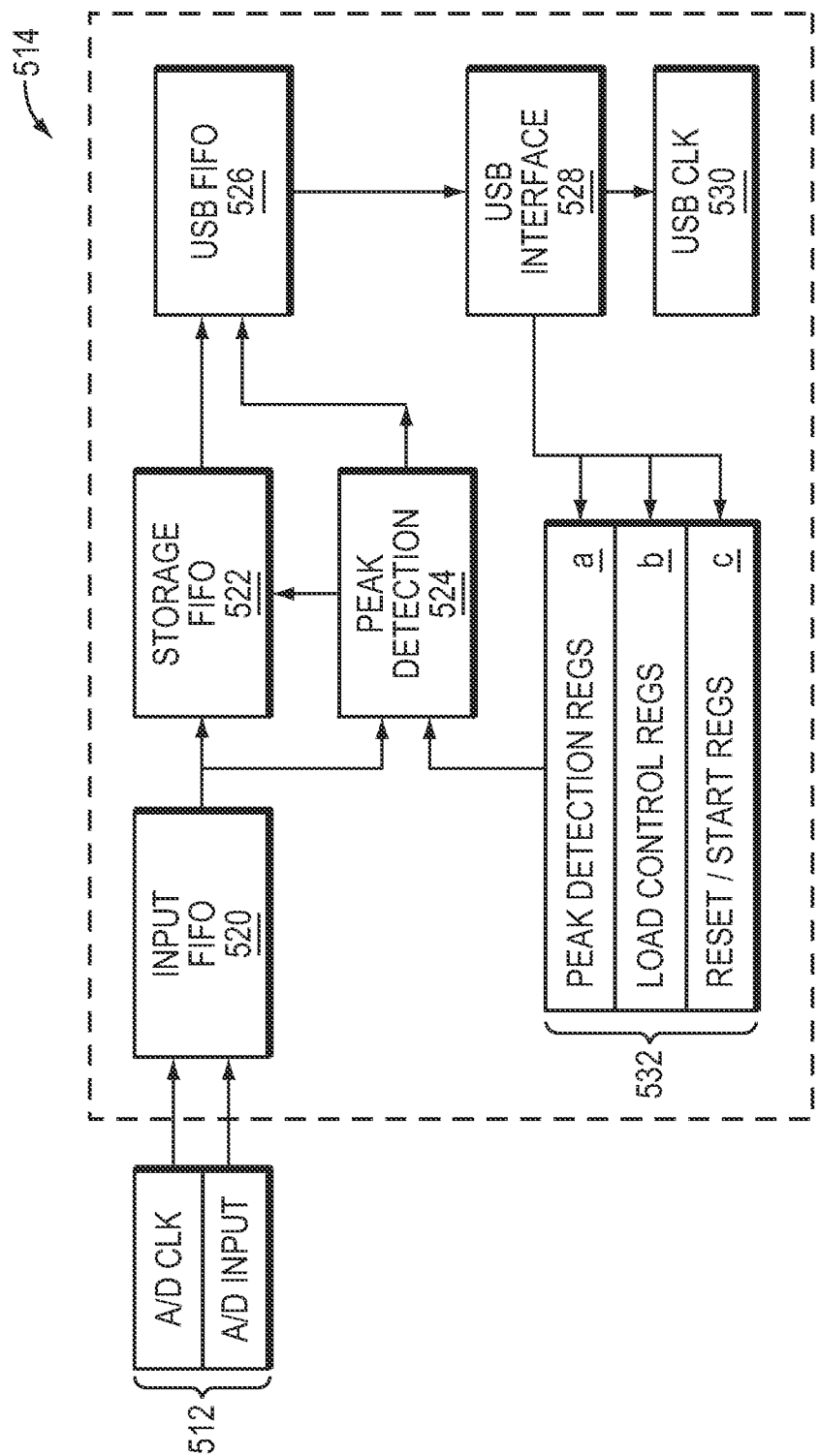
FIG. 8B is a schematic block diagram of a field programmable gate array configuration for a stun device testing apparatus in accordance with an embodiment of the invention.

FIG. 8B depicts an exemplary embodiment of a FPGA 514 utilized in certain embodiments of the invention. The A/D 512 delivers output to an input memory device 520 that, in the depicted embodiment, is a first in/first out (FIFO) memory to compensate for the differing clock speeds between the A/D clock and the USB clock 526, described below. Output from the input memory device 520 is delivered to both a storage device 522 as well as a peak detection device 524. The storage device 522 is also a FIFO and is described in more detail below, in conjunction with other related elements. The peak detection device 524 determines when the waveform discharged from the DUT 502 reaches a peak signal, initiating storage of the waveform information. This data is in turn output to the USB memory device 526, USB interface 528, and USB clock 530. In certain embodiments, the USB memory device 5256 may be a FIFO. The USB interface 528 changes the clock domain to the USB standard clock frequency, which is necessary to avoid loss of data for data sampled at high rates. For example, certain embodiments of the tester may sample data at 105 MHz, significantly faster than the USB clock.

Storage device 522 and USB memory device 526 provide memory space for storing data samples received from the A/D 512. In one embodiment, the storage of the incoming data samples is triggered when the peak detection circuit 524 detects a peak in the incoming waveform. Each sample may represent a fixed amount of capture time, for example, 10 nanoseconds (ns). Because the storage device 522 and USD memory device 526 contain a finite amount of storage space, the size of the storage device 522 and USD memory device 526 sets an upper limit on the total time a waveform may be captured. For example, if the storage device 522 and USD memory device 526 store 100 data samples, the total time is 100×10 ns=1 microsecond (μs). In one embodiment, the storage device 522 and USD memory device 526 store 64,000 samples, providing 640 μs is of total data capture time. Also stored in the FPGA 514 are a number of registers 532 that control operation of the apparatus. These include peak detection registers 532a that control the capture of waveform data associated with the peak, and load control registers 532b that determine the testing load based, at least in part, on the type (i.e., manufacturer, model, etc.) of the DUT 502. Additionally, reset/start registers 532c control when data is taken, when the device is reset, when data capture stops, etc. In one embodiment, the FPGA 514 is able to be re-programmed via the USB interface 528.

The testing apparatus disclosed herein may be a standalone apparatus requiring no connection to a computer. In that case, the processor may run all the necessary analysis and present the required data/info via a screen or other components. In embodiments of the apparatus 500 that include an external computer 518, a LABVIEW™-based graphical user interface (GUI) may be utilized. LABVIEW software is available from National Instruments Corporation, of Austin, Tex. The LABVIEW-based programming may be compiled as an .exe executable file, allowing operation on any Windows-based PC (or Intel-based Macs). If desired, the data displayed to the user may be a subset of the total data analyzed, such that the user is not confused by an overload of details or provided unnecessary information to perform his job. The apparatus may provide the option of delivering more information to the user for more advanced purposes.

During use, when the user selects the stun device to be tested, the program automatically switches to the correct load resistance for that stun device. The user may scan the stun device barcode or enter the stun device serial number, thus initiating a program to look up the appropriate load resistance, which may be stored locally or over a remote network. Raw data may be imported from the FPGA memory array into the program for analysis. While any waveform characteristics may be analyzed, capture and analysis of energy delivered, pulse duration, peak current, and frequency, are desirable for most stun devices. The resultant data may then be compared to known values for the particular device, and the testing apparatus may provide a pass/fail indication to the operator. The waveform and any desired data can be displayed on the user interface. LABVIEW supports saving data locally in a specified location and format, but it may also be desirable to upload the data to an internet database.

In various embodiments of the GUI, a drop down menu may be utilized for the operator to select which stun device is to be tested, or the stun device barcode may be scanned, as described above. The GUI also may utilize areas for data entry, such as serial number, customer name, test operator, etc. A pass or fail indication will illuminate after the data has been analyzed. The waveform may be displayed along with some calculated data such as frequency, peak current, etc., if desired. If available, the stun device manufacturer's expected waveform can be displayed next to the tested device waveform for a visual pass/fail confirmation. A data print out option may be available for printers connected to the computer 518.

As described above with regard to the embodiment of the tester 102 depicted in FIG. 4, multiple ports are utilized on certain embodiments of the stun device tester. The multiple ports may be used to determine an electrical terminal model of the stun device. A terminal model is a conceptual embodiment of a mathematical equation that relates the voltage and current at a terminal pair or port of an electrical circuit. In general, a complex electrical network can be divided into a source and a destination connected by a pair of wires (otherwise known as a port). The source, destination, and even the wires themselves are conceptual. Connecting the source and destination ports constrains the voltage across the wires and the current through the wires to be equal. In mathematics, this is equivalent to solving two equations for two unknown quantities. Consider an example where the source is a stun device that can develop 10,000 volts and a target of approximately 50 ohms resistance. The current developed into the target determines the magnitude of the electric field within the target's body. Assuming the stun device has a very low source resistance, then the prediction might be 10,000 volts/50 ohms=200 amp current. If the assumption is that the resistance of the stun device is 1,000,000 ohms then the current is 10,000 volts/1,000,000 ohms=0.01 amps. Both are assumptions. Accordingly, it is desirable to know the current. Based on testing performed, observed currents in the range of 1 to 10 amps suggest source resistances of 1000 to 10,000 ohms. Determination of an electrical terminal model utilizing multiple ports of the exemplary tester depicted in FIG. 4 is described below.

Figure 10:
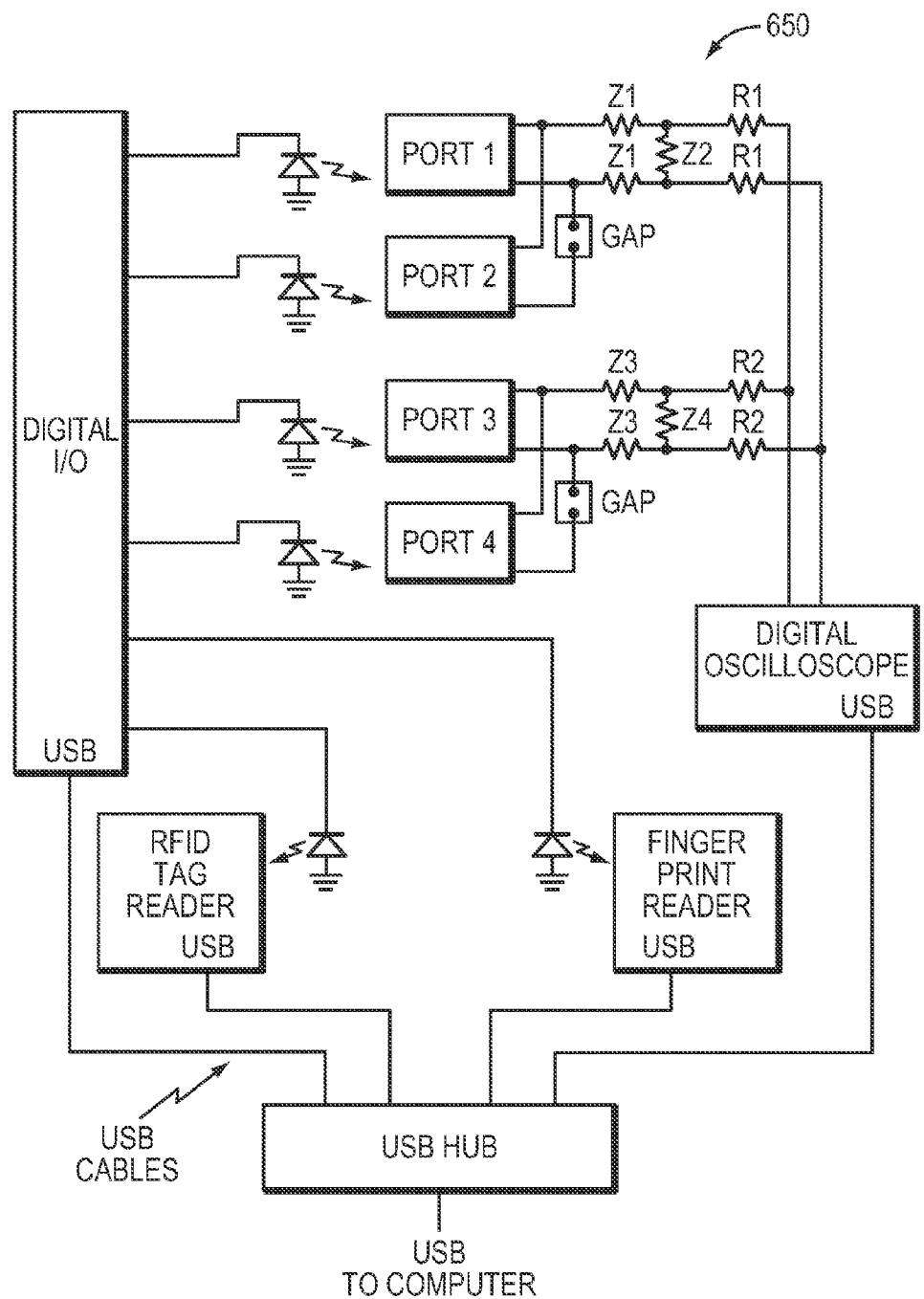
FIG. 10 is a schematic diagram of a circuit utilized in a stun device testing system in accordance with another embodiment of the invention.

FIG. 10 is a schematic diagram of a circuit 650 utilized in a stun device testing system in accordance with one embodiment of the invention. The depicted circuit 650 receives and processes waveforms delivered from a multi-port testing apparatus, such as that depicted in FIG. 4, but components of the circuit 650 may also be used in other circuits and testing apparatus described herein. The testing procedures described below may also be utilized in various embodiments of the testing system described herein. Components include a LAB-JACK digital I/O, a Cleverscope C328A Digital Oscilloscope, an Avertec laptop computer, an HP Laserjet printer, a Zvetco finger print reader, a PhidgetUSA RFID reader, and a Belkin USB hub. All of these components are commercially available and communicate via a USB connection. Discrete electronics are limited primarily to driving LEDs and resistor-capacitor networks that match the signal received in the ports to the requirements of the digital oscilloscope. This latter requirement is further minimized by the digital oscilloscope's ability to detect and adjust itself to the presented signal. These components require no direct observation or contact by the user, although certain embodiments of the device may include options for such direct, contemporaneous observation. The digital oscilloscope operates as a data acquisition device which is observed and controlled by the connected personal computer. The LABJACK interface can generate control signals for the LEDs that guide the user during operation, as described above. The apparatus can also sense contact closures to allow simple signaling from the user, to sense proper positioning of the stun device in the ports, etc. Two modes of operation may be used, one high-speed sampling mode to capture spikes, transients and normal waveform, and a second to assess temporal patterns upon stimulus triggers of about 10 msec pulse, which is sampled and stored as a waveform. All data from a given test is then exported to a computer where detailed comparisons with stored and archival data can be made using appropriate software. Exemplary software can include statistical analysis software programs, such as SYSTAT™, manufactured by Systat Software, Inc., of Chicago, Ill. or MATLAB™, manufactured by The MathWorks, Inc., of Natick, Mass. Other component manufacturers may provide components utilized in the manufacture of the testing device. The above description does not limit similar configurations using different components.

Virtually any characteristics of the electric discharge may be measured, recorded, and analyzed by the device. While the most accurate testers may measure, record, and analyze a significant amount data regarding a waveform, more limited analysis of the waveform may be possible based on a smaller number of characteristics. In addition to capturing an image of the waveform, additional data regarding the discharge may also be collected. Certain embodiments of testing devices may test for one or more of an amplitude, a duration, a current, a voltage, an energy, or a temperature associated with the discharge. Additionally, other data may include: 1) joules per pulse, 2) total joules, 3) peak, average current for at least two different loads, 4) open-circuit voltage, 5) features of spark gap variability, etc. Waveform anomalies to be captured may include: 1) fast spikes, amplitude, rise-fall time, 2) differences in waveforms, rms, peak-to-peak, peak difference, 3) rate 5 to 60 pps, 4) variation in rate, 5) burst rate (patterned bursts), 6) duration of stimulus delivery, 7) measured battery voltage and predicted number of discharges based on battery voltage, 8) temperature of measurement log, etc.

The invention disclosed can be utilized in a variety to ways to verify a manufacturer's claim of specific waveform characteristics and as an indication of the safety of a given waveform. In the case where a manufacturer's claim of a specific waveform and linked safety or injury outcomes are defined, the disclosed invention can compare the waveform as measured against the manufacturer's reported waveform. A suitable comparison can be made in a variety of ways. In one embodiment, the tester can contain a software-based library of waveforms (as reported by the manufacturer) with established thresholds for uncertainty for the primary components of the waveform. For example, the peak current of a waveform is one diagnostic that should remain relatively constant across various loads. An uncertainty of, for example, about ±0.5 A can be established as representing an acceptable deviation from the standard, reported waveform. Higher deviations then can be flagged as outliers and signal can be delivered that the device under test may not be in specification as reported by the manufacturer. Similarly, waveform characteristics such as peak voltage, energy per pulse, cumulative current, energy, etc., can be characterized by "correct" values (i.e., conforming to manufacturer's specifications) and acceptable or unacceptable uncertainties (i.e., deviating from the specifications by an acceptable or unacceptable amount).

Additional features of stun devices, such as frequency, intensity, etc., can be combined creating classes of calculations that can also be measured, calculated, and defined by acceptable or unacceptable uncertainties. In the case of frequency, for example, deviations of approximately plus or minus 5 Hz, could be considered off of manufacturer's specification. When considering the intensity of a waveform, which in one embodiment may be defined as peak values for voltage or current and pulse duration, a similar comparison can be made referring to a reference waveform and deviations therefrom. In the foregoing cases, one example of comparing the manufacturer's stated or claimed waveform to that of a device under test can employ mathematical and statistical comparisons of data components versus load for both a reference and waveform for a specific device under test. Such comparisons can generate plots of each component versus load, for example (i.e., peak current versus load, peak voltage versus load, energy per pulse versus load, etc.). Some examples of waveform testing are described in Savard, P., Walter, R., and Dennis, A., "Analysis of the Quality and Safety of the Taser X26 devices tested for Radio-Canada/Canadian Broadcasting Corporation by National Technical Systems," Test Report 41196-08.SRC (Dec. 2, 2008), the disclosure of which is hereby incorporated by reference herein in its entirety. In another embodiment, current root mean square (rms) values can be calculated and converted into appropriate units as defined by the "Effects of Current on Human Beings and Livestock," IEC Publication 479-1, 3d ed., (1994); and "Effects of Current Passing Through the Human Body," IEC Publication 479-2, 2d ed., (1987). These may then be compared to known rms values and pulse durations of other waveforms to establish safety thresholds for ventricular fibrillation. It is anticipated that, as new standards of safety for stun devices are developed, the disclosed tester can promptly employ such data and software to serve as a safety comparison with a device under test. Thus, the disclosed tester can offer a means to statistically compare a measured waveform with a claimed reference waveform and a means to determine the safety of a given waveform compared to established methods. In addition to comparing the waveform discharged by a device under test to a known manufacturer's standard waveform, the tester can also compare a waveform of a stun device of unknown origin to a database of known waveforms. This comparison can allow the tester to characterize a discharge waveform as potentially safe or unsafe by comparing its characteristics to those of other tested waveforms or manufacturer's standard waveforms that have been determined previously to be safe or unsafe.

Figure 11A:
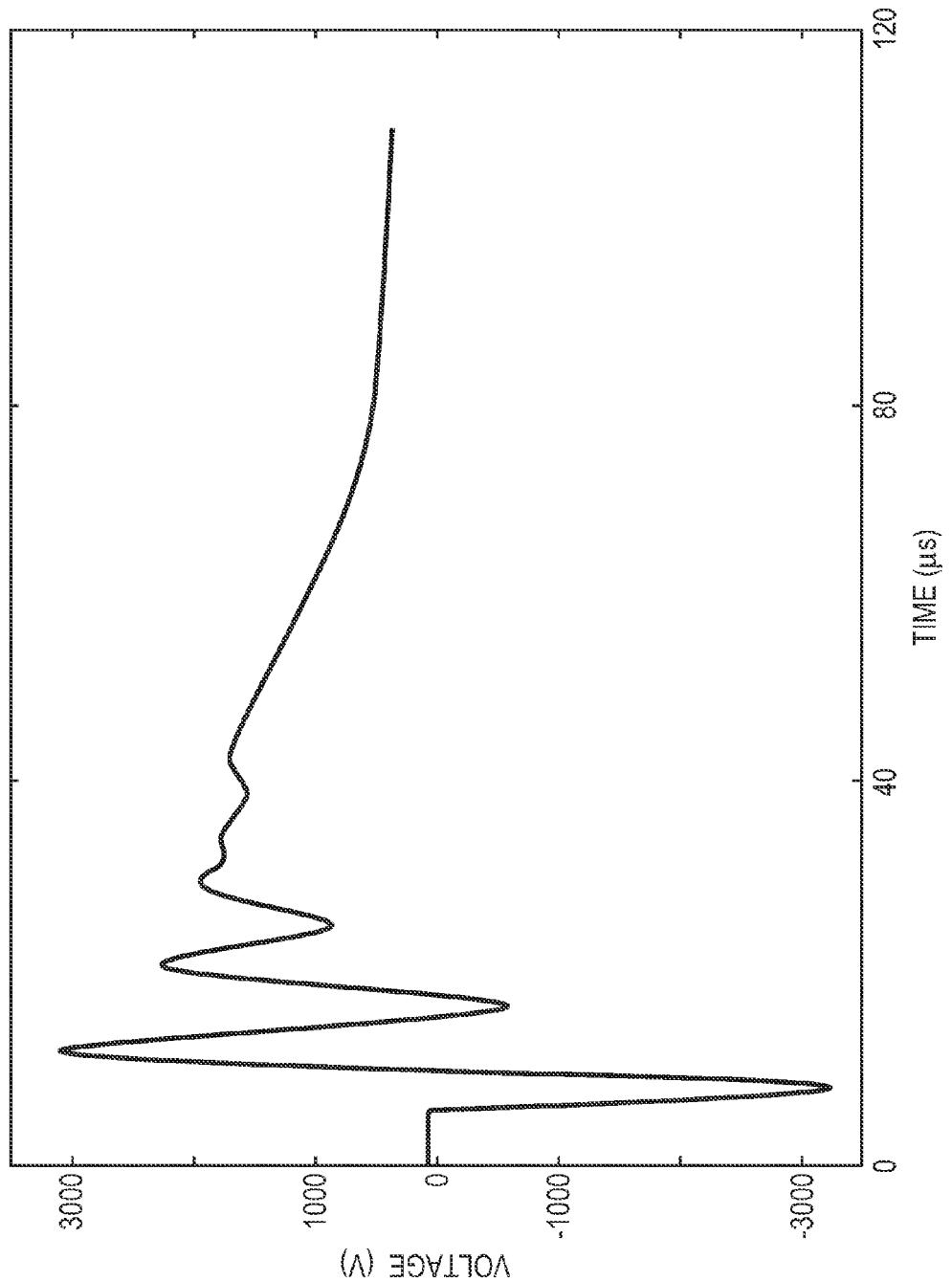
FIGS. 11A-11C depict waveform details and characteristics of the stun device of FIG. 2.
Figure 11B:
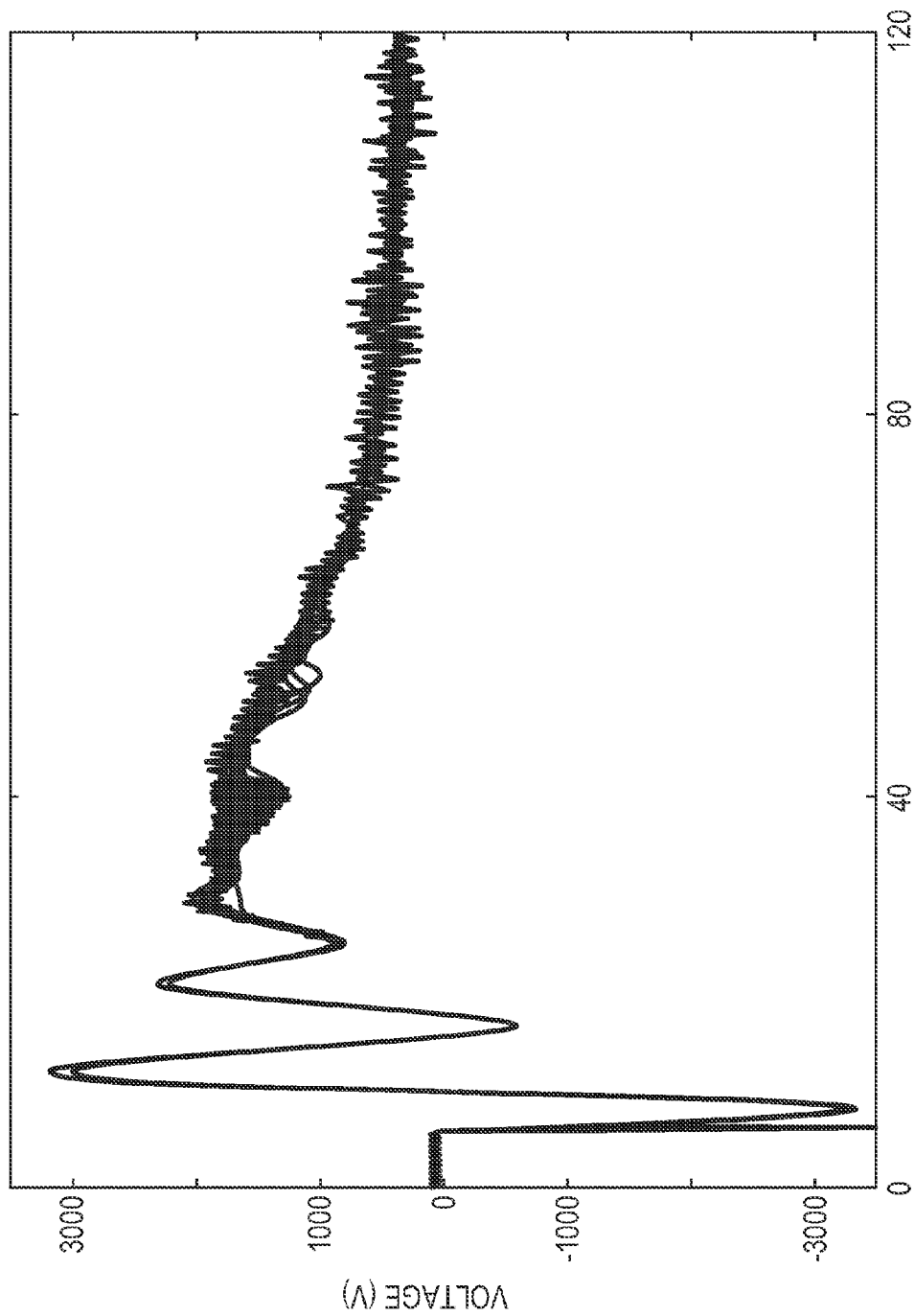
Figure 11C:
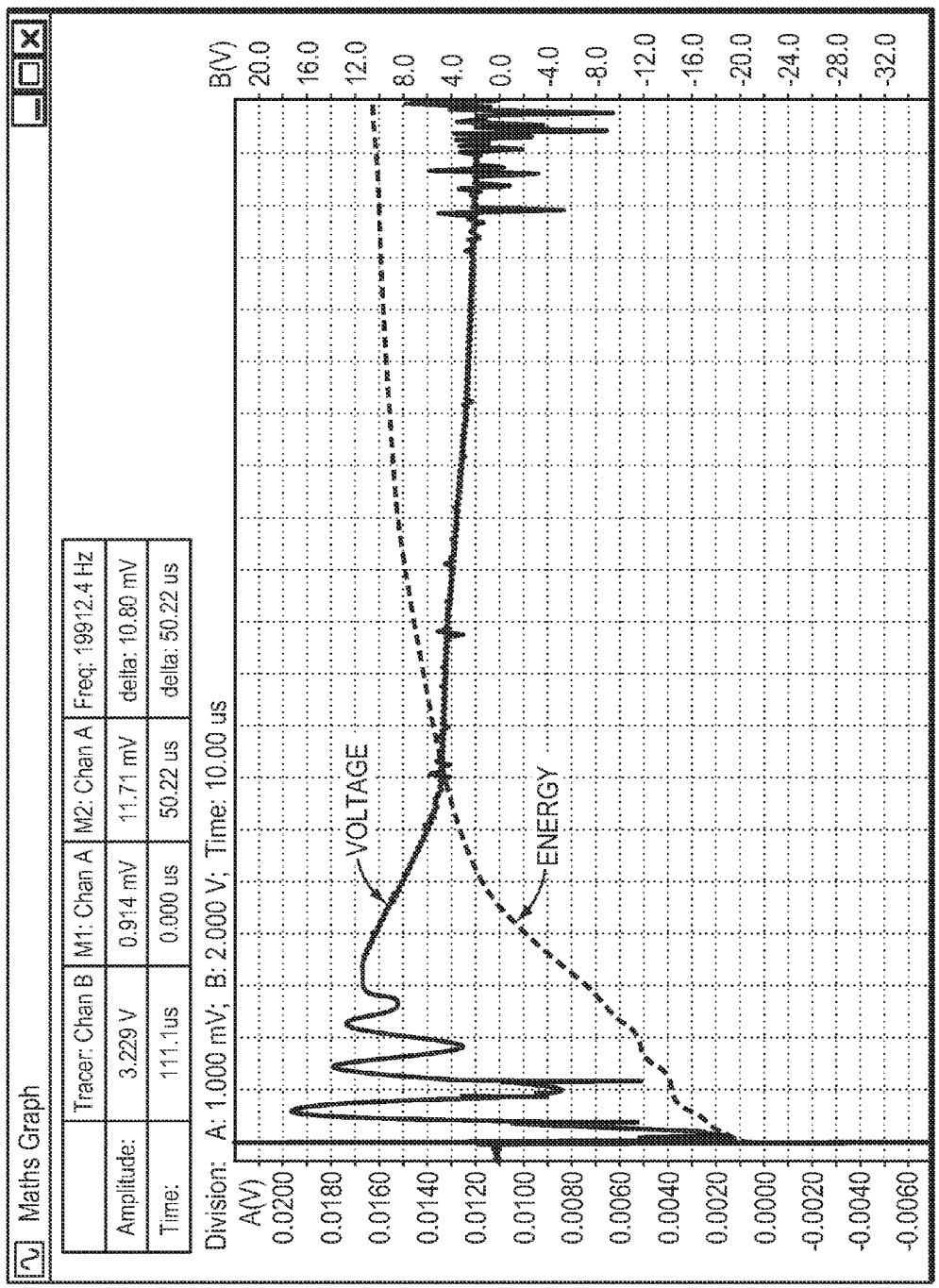

The apparatus and methods described herein may be used to test discharges from stun devices to determine the actual operation of the devices. It should be noted that each discharge from a stun device is not necessarily identical, thus making routine testing desirable. FIG. 11A depicts an "averaged waveform" from a commercially available stun device. FIG. 11B depicts 50 waveforms from the identical stun device, that were combined to make the averaged waveform of FIG. 11A. Notably, FIG. 11B shows variants in the waveform for a plurality of discharges, including transients. Although the general waveform shape is the same, the variants present in each discharge may aid in determining the biological effects of the stun device discharge on a human. FIG. 11C depicts a single discharge of the stun device of FIGS. 11A and 11B, depicting both voltage and the accumulating energy.

Figure 12:
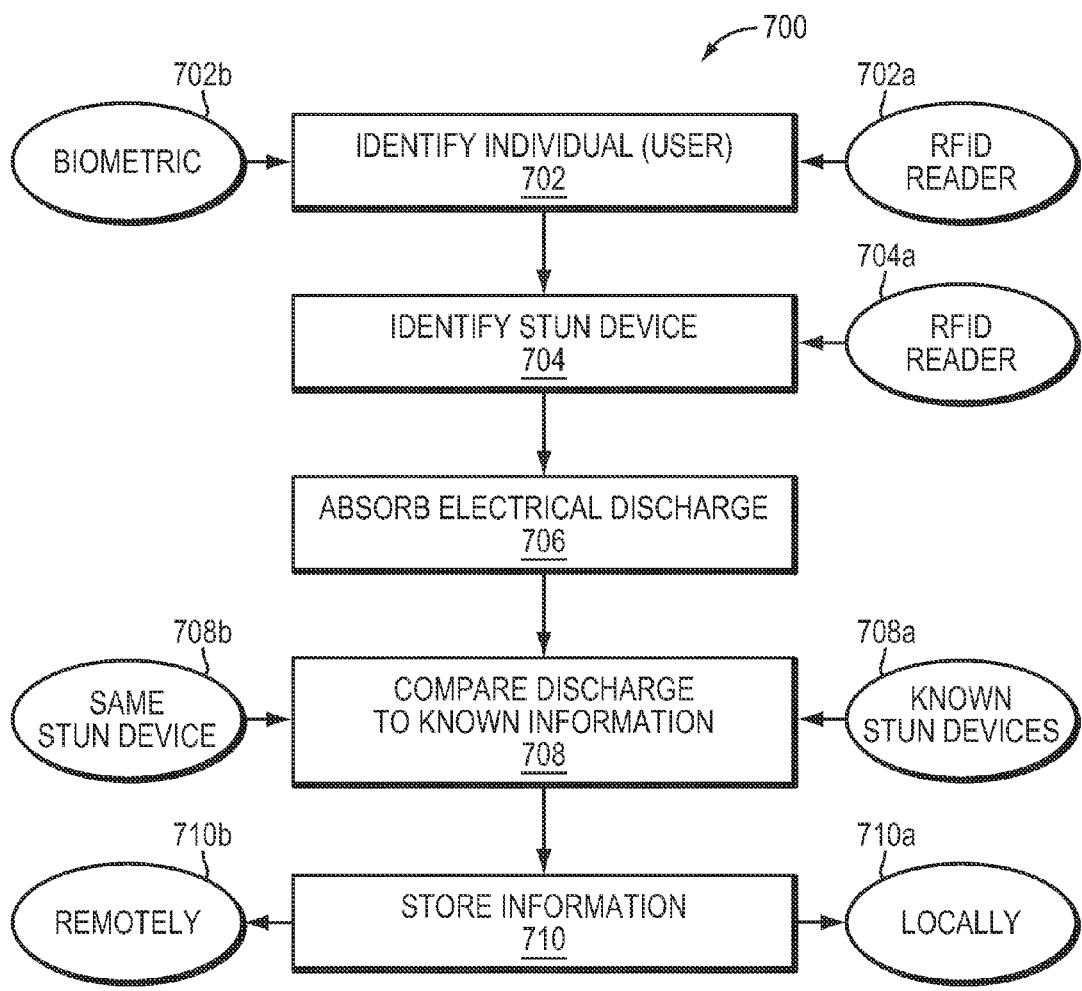
FIG. 12 depicts a method of testing an electric discharge stun device, in accordance with one embodiment of the invention.

FIG. 12 depicts a method of testing an electric discharge stun device 700. The testing method 700 may begin by first identifying the user of the test apparatus and/or stun device 702. This identification may include one or more identification options. For example, the user may scan a badge containing an RFID circuit 702a. Alternatively or additionally, a biometric sensor (fingerprint scanner, voice detection device, eye scanner, etc.) may be utilized to identify the user. In a basic embodiment, a user may enter an identifying code or password, either through an external computer, or on the tester itself, to begin the testing sequence. Thereafter (or initially, if identification of the user is not desired), the stun device being tested may be identified to the tester 704. This may include scanning an RFID tag 704a located on the device, scanning a bar code or other optical identification device, or simply entering a device serial number into the external computer or the tester itself. Thereafter, the discharge end of the stun device is placed against a testing port of the tester and the stun device. The resulting electrical discharge is absorbed by the tester 706. Step 706 may be repeated for any number of ports or test conditions. In one embodiment described herein, four separate ports are utilized.

Once the device has been discharged, the test device (or a computer connected thereto) compares the discharge to known, stored information 708. This comparison may serve a number of purposes. In one instance, the discharge may be compared to discharges of known stun devices from one or more manufacturers 708a, this comparative information being stored either locally, remotely, or both. By comparing the discharge to the discharges of known stun devices, a previously unidentified stun device may be identified based on characteristics of its discharge. If the device under test is of an unknown manufacture, or is a new model from a known manufacturer, the discharge may be analyzed to determine whether it matches a known device, or if it has a waveform similar to that already produced by a particular manufacturer. Alternatively, the discharge from a previously unknown or untested device can be compared to known devices to determine if any discharge characteristics are shared. Knowledge of these discharge characteristics and the body's response thereto can help determine if the device is safe to use. In a second instance, the discharge may be compared to a previous discharge from the same device 708b, thus allowing a determination regarding the history and potential future performance (due to, for example, consistent waveform degradation) of the stun device. Regardless of what information the discharge characteristics are compared to, the information regarding the discharge may be stored in a storage medium 710, either locally 710a on the tester, or remotely 710b on a computer or remote database. This stored information may be used to create a repository of electrical discharge information for further access and study. In additional, information within the repository may include specifications of known stun devices and analysis based on the physical design of the device. In that regard, discharge characteristics may be predicted based on a comparison of specifications, as well.

Figure 13:
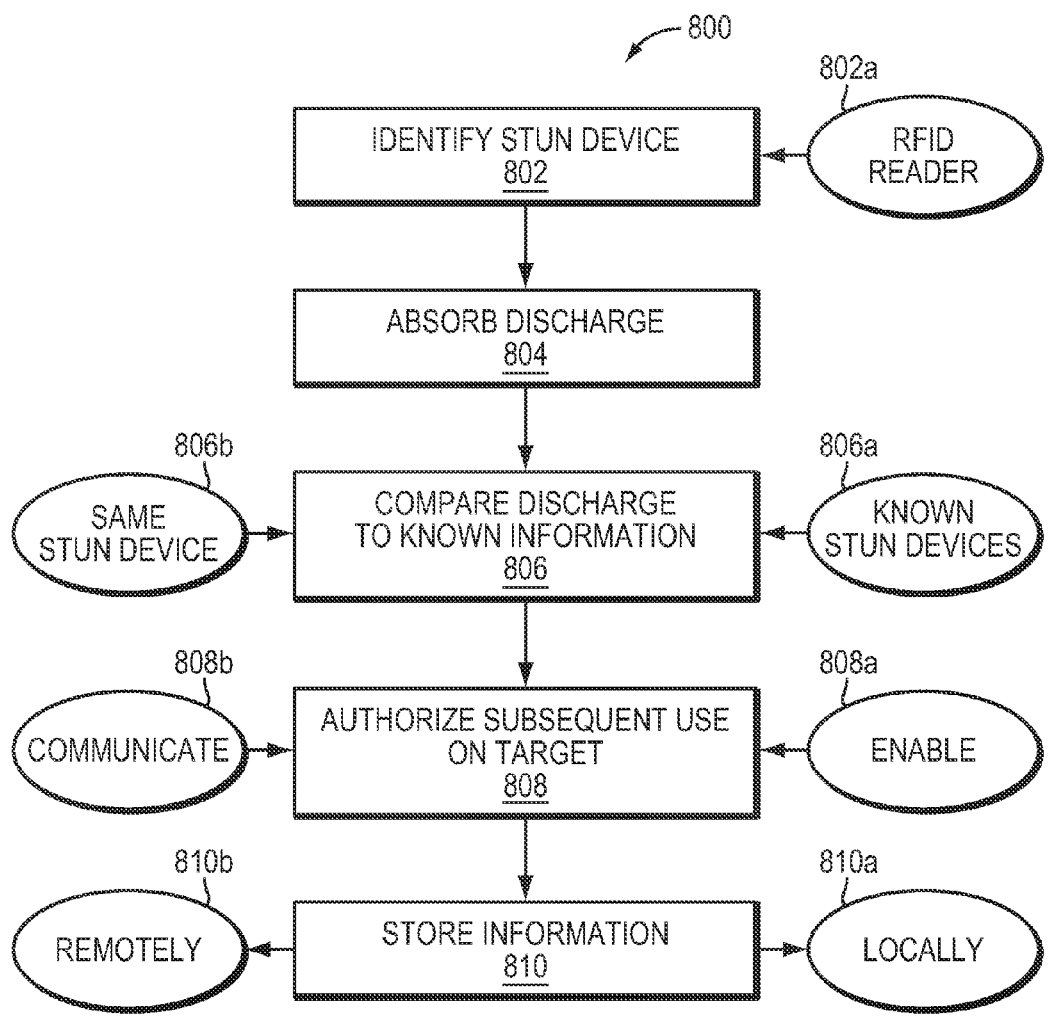
FIG. 13 depicts a method of ensuring proper operation of an electric discharge stun device, in accordance with one embodiment of the invention.

FIG. 13 depicts a method of ensuring proper operation of an electric discharge stun device 800, in accordance with one embodiment of the invention. As an initial step, the device may be identified 802, either using an RFID reader 802a or some other mechanism, as described above. Next, a user activates the device against one or more ports of the tester, which absorbs the discharge 804, as described above. In step 806, the discharge of the device is compared to known information, either from known stun devices 806a or from the same stun device 806b. Again, issues attendant with the comparisons are described above. Thereafter, the tester, or a computer associated therewith, analyzes the results of the comparison and makes a determination as to whether the device is functioning properly, prior to any subsequent operation against a human target.

If the device discharges an appropriate waveform (e.g., corresponds to some other waveform previously determined to be "safe" or within manufacturer's specifications), the tester may authorize subsequent use of the stun device on a target 808. This authorization may be made in a number of ways. First, the tester may automatically enable or disable the device 818a, via a communication between the tester and the internal circuitry of the stun device. This action may be made via the lead described with regard to FIG. 6. Alternatively, the tester may send out a wireless signal to enable or disable the stun device. Additionally, the tester may communicate to the user 808b (either via an audible or visible indicator) whether the stun device is performing properly. In addition to an absolute indicator of proper performance, the testing device may calculate a confidence value for proper performance based on analysis of the waveform and comparisons to known waveforms. Additionally, authorization may not be required for every subsequent discharge. The testing apparatus may authorize use of the stun device over a limited period of time, or until the stun device is next used against a human target. Regardless of the authorization step, the information regarding the discharge characteristics may be stored 810, either locally 810a or remotely 810b, at least for the purposes described above.

Figure 14:
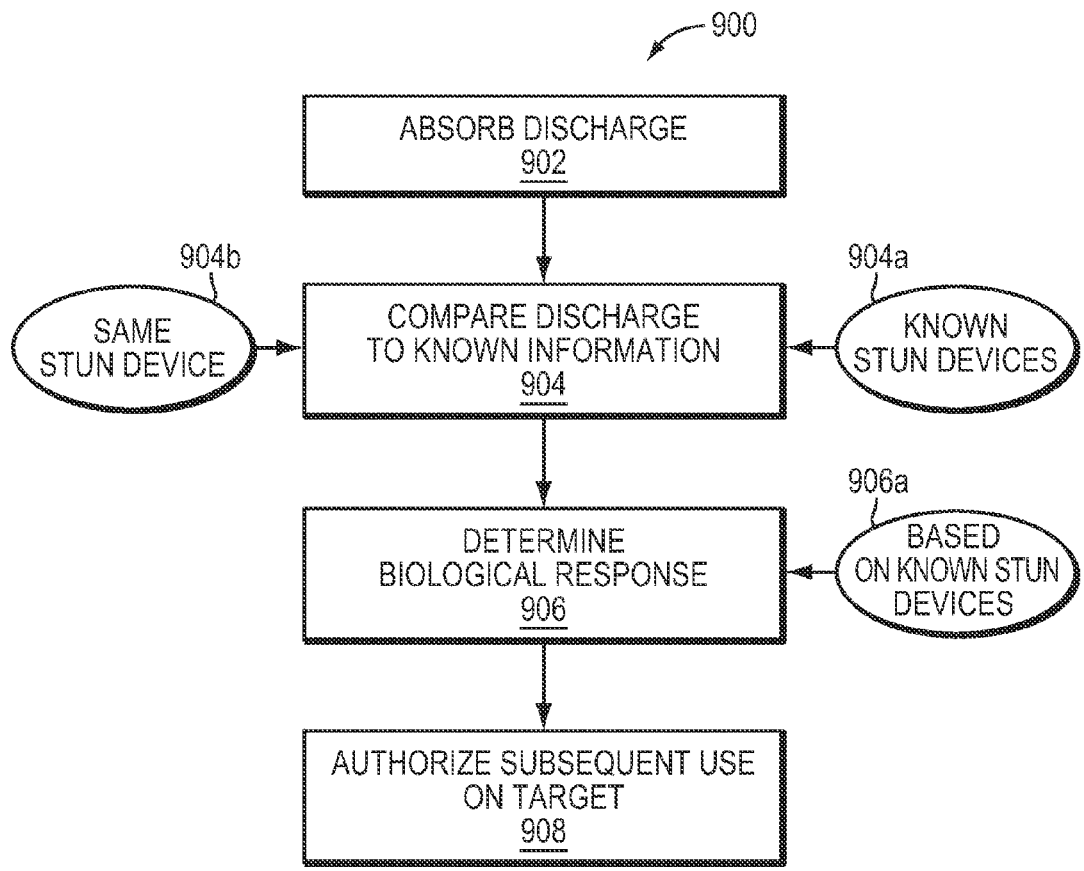
FIG. 14 depicts a method of determining a biological response to an electric discharge from a stun device, in accordance with one embodiment of the invention.

The two testing methods described above in FIGS. 12 and 13 enable another function of the present invention. FIG. 14 depicts a method of determining a biological response to an electric discharge from a stun device 900, in accordance with one embodiment of the invention. The first two steps are similar to those described above. A discharge is first absorbed by the tester 902. Information from that discharge is next compared to known information 904, either from the same stun device 904b, or from the repository of information regarding known stun devices 904a, or even from theoretical information based on the physical design of the stun device under test. Included in the repository are also known biological responses to known electrical discharges from known stun devices 906a. Based on this information, the tester can predict a likely biological response of a human target upon which the stun device is subsequently discharged 906, which may aid in an authorization step 908, as described above with regard to FIG. 13.

A variety of biological responses may be predicted based on the information obtained from the electrical discharge. Exemplary biological responses may include those that affect all or a significant number of muscles of the body, for example, tetany, partial tetany, substantially complete tetany, etc. Tetany and related biological responses are described in U.S. Patent Application Publication No. 2007/0167241, the entire disclosure of which is hereby incorporated by reference herein in its entirety. In addition, it can be advantageous to determine biological responses that may be considered undesirable or dangerous. Such biological responses may include organ damage, abnormal heart rhythms, epileptic seizures, localized cell death or damage (due to, for example, burns), or complete incapacitation or death of the target. Additionally, information obtained from the electrical discharge may lead to a conclusion that no biological response or an ineffective biological response will be produced by the electrical discharge.

In the embodiments described above, the software may be configured to run on any computer or workstation such as a PC or PC-compatible machine, an Apple Macintosh, a Sun workstation, etc. In general, any computing device can be used, as long as it is able to perform the functions and capabilities described herein. The particular type of computer or workstation is not central to the invention, nor is the configuration, location, or design of the database, which may be flat-file, relational, or object-oriented, and may include one or more physical and/or logical components.

The servers may include a network interface continuously connected to the network, and thus support numerous geographically dispersed users and applications. In a typical implementation, the network interface and the other internal components of the servers intercommunicate over a main bi-directional bus. The main sequence of instructions effectuating the functions of the invention and facilitating interaction among clients, servers and a network, can reside on a mass-storage device (such as a hard disk or optical storage unit) as well as in a main system memory during operation. Execution of these instructions and effectuation of the functions of the invention is accomplished by a central-processing unit ("CPU").

A group of functional modules that control the operation of the CPU and effectuate the operations of the invention as described above can be located in system memory (on the server or on a separate machine, as desired). An operating system directs the execution of low-level, basic system functions such as memory allocation, file management, and operation of mass storage devices. At a higher level, a control block, implemented as a series of stored instructions, responds to client-originated access requests by retrieving the user-specific profile and applying the one or more rules as described above.

While there have been described herein what are to be considered exemplary and preferred embodiments of the present invention, other modifications of the invention will become apparent to those skilled in the art from the teachings herein. The particular methods of operation and manufacture and configurations disclosed herein are exemplary in nature and are not to be considered limiting. It is therefore desired to be secured in the appended claims all such modifications as fall within the spirit and scope of the invention. Accordingly, what is desired to be secured by Letters Patent is the invention as defined and differentiated in the following claims, and all equivalents.

The invention claimed is:

1. A method of testing an electric discharge stun device, the method comprising:
   absorbing a test discharge from a stun device into a tester, the test discharge comprising a test discharge characteristic;
   comparing automatically the test discharge characteristic to a standard discharge characteristic of the stun device; and
   indicating whether the discharge characteristic corresponds to the standard discharge characteristic,
   wherein the test discharge characteristic and the standard discharge characteristic each comprise at least one of a waveform, an amplitude, a duration, a current, a voltage, an energy, and a temperature.

2. The method of claim 1, wherein the information associated with the standard discharge characteristic is provided by a manufacturer of the stun device.

3. The method of claim 1, further comprising receiving at least a portion of the stun device in at least one of a plurality of ports on the tester.

4. The method of claim 1, further comprising identifying the stun device.

5. The method of claim 4, wherein the identifying operation occurs prior to the absorbing step.

6. The method of claim 4, further comprising identifying a user of the stun device.

7. The method of claim 6, wherein the indicating operation occurs subsequent to the stun device identification operation and the user identification operation.

8. The method of claim 1, further comprising storing information comprising the test discharge characteristic.

9. The method of claim 1, wherein the test discharge characteristic and the standard discharge characteristic comprise at least one of a duration, a current, and a voltage.

10. A tester for testing an electric discharge stun device, the tester comprising:
    a stun device contact element for receiving a discharge from a stun device;
    a circuit connected to the contact element;
    a storage medium for storing information corresponding to (a) at least one of the stun device and the discharge from the stun device, and (b)
    a known electrical discharge;
    a processor connected to the circuit for comparing at least one of the stun device information and the discharge information to the known electrical discharge information, wherein the known electrical discharge information comprises at least one of a waveform, an amplitude, a duration, a current, a voltage, an energy, and a temperature; and
    a stun device identification element connected to the processor.

11. The tester of claim 10, wherein the contact is located within a port.

12. The tester of claim 10, wherein the contact comprises a plurality of contacts.

13. The tester of claim 10, further comprising a display coupled to the processor.

14. The tester of claim 13, wherein the display displays information regarding at least one of an operation of the stun device and an operation of the tester.

15. The tester of claim 14, wherein the information regarding operation of the stun device comprises a test result.

16. The tester of claim 10, further comprising a connection for interfacing the tester with a remote computer.

17. The tester of claim 10, wherein the tester comprises an adapter for mating with a predetermined stun device.

18. The tester of claim 13, wherein the display comprises a touch screen.

19. The tester of claim 10, wherein the stun device identification element comprises a touch screen.

20. The tester of claim 19, wherein the touch screen comprises a graphical user interface.

* * * * *